United States Patent [19]
Godiwala et al.

[11] Patent Number: 5,629,950
[45] Date of Patent: May 13, 1997

[54] FAULT MANAGEMENT SCHEME FOR A CACHE MEMORY

[75] Inventors: Nitin D. Godiwala, Boylston; Kurt M. Thaller, Acton; Jeffrey A. Metzger, Leominster; Barry A. Maskas, Sterling, all of Mass.

[73] Assignee: Digital Equipment Corporation, Maynard, Mass.

[21] Appl. No.: 676,987

[22] Filed: Jul. 8, 1996

Related U.S. Application Data

[63] Continuation of Ser. No. 297,273, Aug. 26, 1994, abandoned, which is a continuation of Ser. No. 874,241, Apr. 24, 1992, abandoned.

[51] Int. Cl.[6] ............................................. G06F 11/10
[52] U.S. Cl. ..................... 371/51.1; 395/458; 395/471; 364/245.44; 364/265.3; 364/DIG. 1; 371/40.2
[58] Field of Search ........................... 371/40.1, 40.2, 371/48, 49.1, 51.1; 395/185.01, 185.06, 427, 445, 458, 460, 471, 472; 364/243.41, 243.44, 265.3

[56] References Cited

U.S. PATENT DOCUMENTS

| | | |
|---|---|---|
| 4,357,656 | 11/1982 | Saltz et al. . |
| 4,543,628 | 9/1985 | Pomfret .................................. 371/32 |
| 5,155,843 | 10/1992 | Stamm et al. ......................... 364/200 |
| 5,175,859 | 12/1992 | Miller et al. . |
| 5,226,150 | 7/1993 | Callander et al. ................... 395/575 |
| 5,253,203 | 10/1993 | Partovi et al. .................. 365/189.02 |

OTHER PUBLICATIONS

Implementation of Last Tag Indicators Using Illegal Tag Table Entries, Research Disclosure Oct. 1989.

*Primary Examiner*—Hoa T. Nguyen
*Assistant Examiner*—Albert Décady
*Attorney, Agent, or Firm*—Lindsay G. McGuinness; Denis G. Maloney; Arthur W. Fisher

[57] ABSTRACT

The present invention is directed to a method of managing a cache upon detection of an address TAG parity error. The cache includes a plurality of entries for storage of data, with each entry having a corresponding address TAG entry. The method includes the steps of performing a TAG parity check for each access to the cache, and upon detection of a parity error in an address TAG, disabling allocation of TAG entries for storage of new address TAGs. A signal indicating the TAG parity error is transmitted to an error correction mechanism.

10 Claims, 9 Drawing Sheets

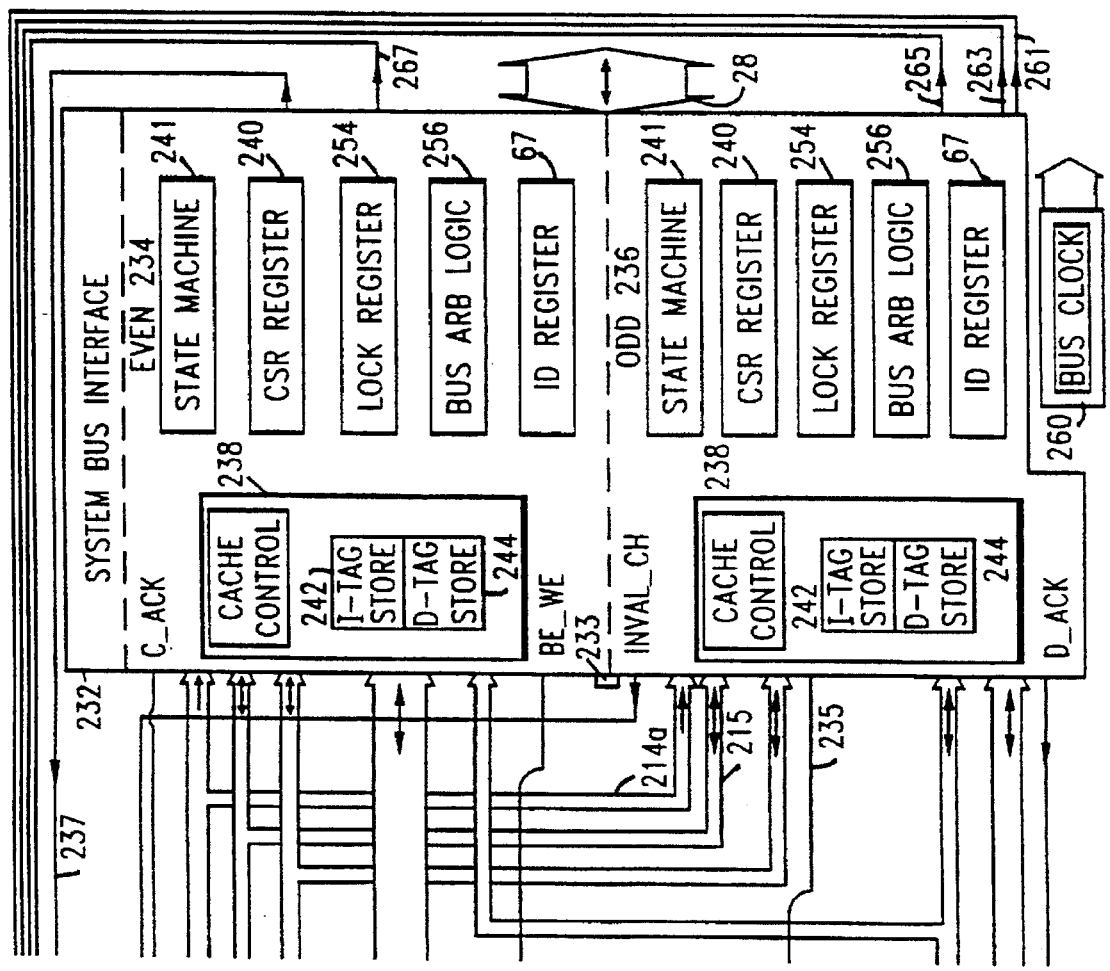

CHART OF READ CONTROL FLOW

| BUS RETURN OF DATA | | b-CACHE WRITE ENABLE SIGNALS | | PROCESSOR DATA ACKNOWLEDGEMENT SIGNALS | | PROCESSOR CYCLE ACKNOWLEDGEMENT SIGNALS |
|---|---|---|---|---|---|---|
| FIRST 128 BIT PORTION | SECOND 128 BIT PORTION | FIRST 128 BIT PORTION | SECOND 128 BIT PORTION | FIRST 128 BIT PORTION | SECOND 128 BIT PORTION | FOR READ OPERATION |
| | | BE_WE BO_WE | BE_WE BO_WE | D_ACK | D_ACK | |
| CASE 1 | OK | OK | ASSERTED GOOD ECC | ASSERTED GOOD ECC | ASSERTED GOOD ECC | ASSERTED GOOD ECC | CACK |
| CASE 2 | PARITY ERROR | OK | ASSERTED GOOD ECC | ASSERTED GOOD ECC | ASSERTED GOOD ECC | ASSERTED GOOD ECC | HARD_ERROR |
| CASE 3 | OK | PARITY ERROR | ASSERTED GOOD ECC | ASSERTED GOOD ECC | ASSERTED GOOD ECC | ASSERTED GOOD ECC | HARD_ERROR |
| CASE 4 | OK CUC_ERROR | OK | ASSERTED BAD ECC | ASSERTED GOOD ECC | ASSERTED GOOD ECC | ASSERTED GOOD ECC | HARD_ERROR |
| CASE 5 | OK | OK CUC_ERROR | ASSERTED GOOD ECC | ASSERTED BAD ECC | ASSERTED GOOD ECC | ASSERTED BAD ECC | HARD_ERROR |

FIG. 9

FAULT MANAGEMENT SCHEME FOR A CACHE MEMORY

This application is a continuation of application Ser. No. 08/297,273, filed Aug. 26, 1994, now abandoned, which application is a continuation of application Ser. No. 07/874,241, filed Apr. 24, 1992, now abandoned.

FIELD OF THE INVENTION

The present invention is directed to a scheme for managing faults in a cache memory, and, more particularly, to a scheme for handling parity errors in cache memory TAG entries.

BACKGROUND OF THE INVENTION

Modern computer systems utilize various technologies and architectural features to achieve high performance operation. These technologies and architectural features include reduced instruction set computers, high speed cache memories and multiprocessor systems. Innovative arrangements of high performance components embodying one or more of the above can often result in significant improvements in the capabilities and processing power of a computer system.

A reduced instruction set computer (RISC technology) represents a "back to basics" approach to semiconductor chip design. An instruction set comprises a set of basic commands for fundamental computer operations, such as the addition of two data values to obtain a result. The instructions of an instruction set are typically embedded or hard wired into the circuitry of the chip embodying the central processing unit of the computer, and the various statements and commands of an application program running on the computer are each decoded into a relevant instruction or set of instructions of the instruction set for execution.

LOAD, ADD and STORE are examples of basic instructions that can be included in a computer's instruction set. Such instructions may be used to control, for example, the movement of data from memory to general purpose registers, addition of the data in the registers by the arithmetic and logic unit of the central processing unit, and return of the result to the memory for storing. In recent years, with significant advances in the miniaturization of silicon chips, chip designers began to etch more and more circuits into the chip circuitry so that instruction sets grew to include hundreds of instructions capable of executing, via hard wired circuitry, sophisticated and complex mathematical and logical operations.

A problem with the proliferation of instructions included in an instruction set is that the increasing complexity of the circuitry required to implement a large number of instructions resulted in a slow down in the processing speed of the computer. Moreover, it was determined that a relatively small percentage of the instructions of the instruction set were performing a large percentage of the processing tasks of the computer. Thus, many of the instructions have become "expensive" options, whose relatively infrequent use does not make up for the slow down caused by large instruction sets.

The objective of a RISC design is to identify the most frequently used instructions of the instruction set and delete the remaining instructions from the set. A chip can then be implemented with a reduced, but optimal number of instructions to simplify the circuitry of the chip for increased speed of execution for each instruction. While a complex operation previously performed by a single instruction may now have to be executed via several more basic instructions, each of those basic instructions can be executed at a higher speed than was possible before reduction of the instruction set. More significantly, when the instructions retained in the instruction set are carefully selected from among those instructions performing the bulk of the processing within the computer, the RISC system will achieve a significant increase in its overall speed of operation since that entire bulk of processing will be performed at increased speed.

By way of example, in some "large" instruction set systems, twenty percent of the instructions were performing eighty percent of the processing work. Thus a RISC system comprising the twenty percent of the instructions would achieve significantly higher speeds of operation during the performance of eighty percent of the workload.

The high performance capabilities achieved in a RISC computer are further enhanced when a plurality of such RISC computers is arranged in a multiprocessor system utilizing cache memories. A multiprocessor system can comprise, e.g., a plurality of RISC computers, an I/O device and a main memory module or modules, all coupled to one another by a high performance backplane bus. The RISC computers can be utilized to perform co-operative or parallel processing as well as multi-tasking among them for execution of several applications running simultaneously, to thereby achieve dramatically improved processing power. The capabilities of the system can be further enhanced by providing a cache memory at each one of the RISC computers in the system.

A cache memory comprises a relatively small, yet relatively fast memory device arranged in close physical proximity to a processor. The utilization of cache memories is based upon the principle of locality. It has been found, for example, that when a processor accesses a location in memory, there is a high probability that the processor will continue to access memory locations surrounding the accessed location for at least a certain period of time. Thus, a preselected data block of a large, relatively slow access time memory, such as a main memory module coupled to the processor via a bus, is fetched from the main memory and stored in the relatively fast access cache memory. Accordingly, as long as the processor continues to access data from the cache memory, the overall speed of operation of the processor is maintained at a level significantly higher than would be possible if the processor had to arbitrate for control of the bus and then perform a memory read or write operation, with the main memory module, for each data access.

While the above described cached, multi-processor RISC computer system represents a state-of-the-art model for a high performance computer system, the art has yet to achieve an optimal level of performance efficiency.

One problem that arises in cached computer systems pertains to faults detected in cache entries, in particular, errors in TAG fields of cache entries. TAG fields are used to identify main memory addresses for data items stored in a cache memory. Such errors are typically detected when the system attempts to probe a cache's TAG store and determines that the address or status information contained in the TAG store has a parity error. In typical cache memory systems, parity information is commonly provided for each TAG entry for the purpose of error detection. A parity error is detected by calculating the parity of the TAG entry being accessed and comparing the result to the entry's associated parity bit. A mismatch between the calculated parity value and the value of the entry's parity bit constitutes a parity error.

A known approach to dealing with this problem of TAG parity errors has been to assume that the probe of the cache actually resulted in a miss and to assert an interrupt request signal indicative of such errors. A substantial amount of time, however, may elapse between the interrupt request and the completion of the error interrupt service routine. During this time, the contents of the cache may become incoherent with the rest of the computer system's memory. Such incoherence problems are a major disadvantage of this known approach to dealing with TAG parity errors.

Another known approach to the handling of TAG parity errors has been to assume that the probe resulted in a miss and not to take any action. This approach is based on the assumption that the computer system will eventually detect the error condition and correct it. The disadvantage of this policy, however, is that the system may malfunction without giving any indication. Furthermore, as with the other known approach, the contents of the cache may become incoherent with the rest of the computer system's memory.

SUMMARY OF THE INVENTION

The present invention is directed to a scheme for managing a cache memory when a parity error is detected in a TAG entry of that cache. Generally, the scheme of the present invention preserves the faulty cache entry, pending resolution of the problem, while maintaining normal cache operation to the greatest extent possible and assuring the coherency of the cache with the rest of the system's memory.

According to the scheme of the present invention, when a parity error is detected in a TAG address entry of a cache, allocation of new entries into the cache is disabled i.e., the address TAGs of the cache are frozen in the state existing at the time of detection of the TAG parity error. This step can be done automatically and thus very quickly. If the error was detected upon a processor-initiated bus transaction, the requested transaction is converted into a "No-op", i.e a NULL operation, and the processor is informed of the error by means of a hard error signal.

If the TAG parity error was detected upon a system bus initiated probe of the cache TAG store in search of data, an error signal is asserted over the bus and the data associated with the faulty TAG entry is not forwarded by the cache. However, the computer's memory module's may be permitted to supply the requested data in response to the read operation. The module which receives the data will be informed of the existence of an error as a result of the assertion of the error signal by the bus interface unit which detected the TAG parity error. Accordingly, the processor receiving the data will be informed of the error and data coherency will be maintained.

If the TAG parity error was detected upon a bus-initiated probe seeking to write data to the cache, the data is not accepted by the cache.

With the detection of a TAG parity error, information concerning the parity error is logged for investigation. The occurrence of subsequent errors before the resolution of the problem, and re-enablement of the cache, is flagged but such errors are not individually logged. The processor, however, is informed of each error via the hard error signal.

The transaction upon which the parity error is first detected leaves the cache intact, i.e. no TAG or data entry is modified. Furthermore, while allocation is disabled, subsequent transactions cannot alter the set of TAG address entries in the cache. However, probes of the cache's TAG store are allowed and the modification of an entry's status is possible with the exception of the entry having a TAG parity error.

If a transaction would have caused an error-free cache entry to be victimized, the contents of that entry are written to main memory, but the entry will not be overwritten in the cache since allocation is disabled. In order to maintain the coherency of the cache with the rest of the system's memory, if a bus write operation occurs to a target location with an entry in the cache, the entry is updated accordingly. Furthermore, if a bus read transaction occurs and the data sought is in an error-free cache entry with the latest version of the data, the cache will forward the data.

The frozen state for the address TAGs of the cache is maintained until the parity error is handled (e.g. corrected). After the TAG parity error is corrected, the state of the address TAGs is unfrozen and normal operation of the cache resumes.

Thus, unlike known systems, the scheme of the present invention allows substantial use of a cache memory in which an error in a TAG entry is detected, while resolution of the error is pending. Moreover, coherency of the cache is maintained and any potential degradation in system performance is minimized.

BRIEF DESCRIPTION OF THE DRAWINGS

FIG. 9 illustrates the state machine control flow of the CPU module's bus interface unit during a read transaction in accordance with an exemplary embodiment of the present invention.

DETAILED DESCRIPTION

Figure 1:
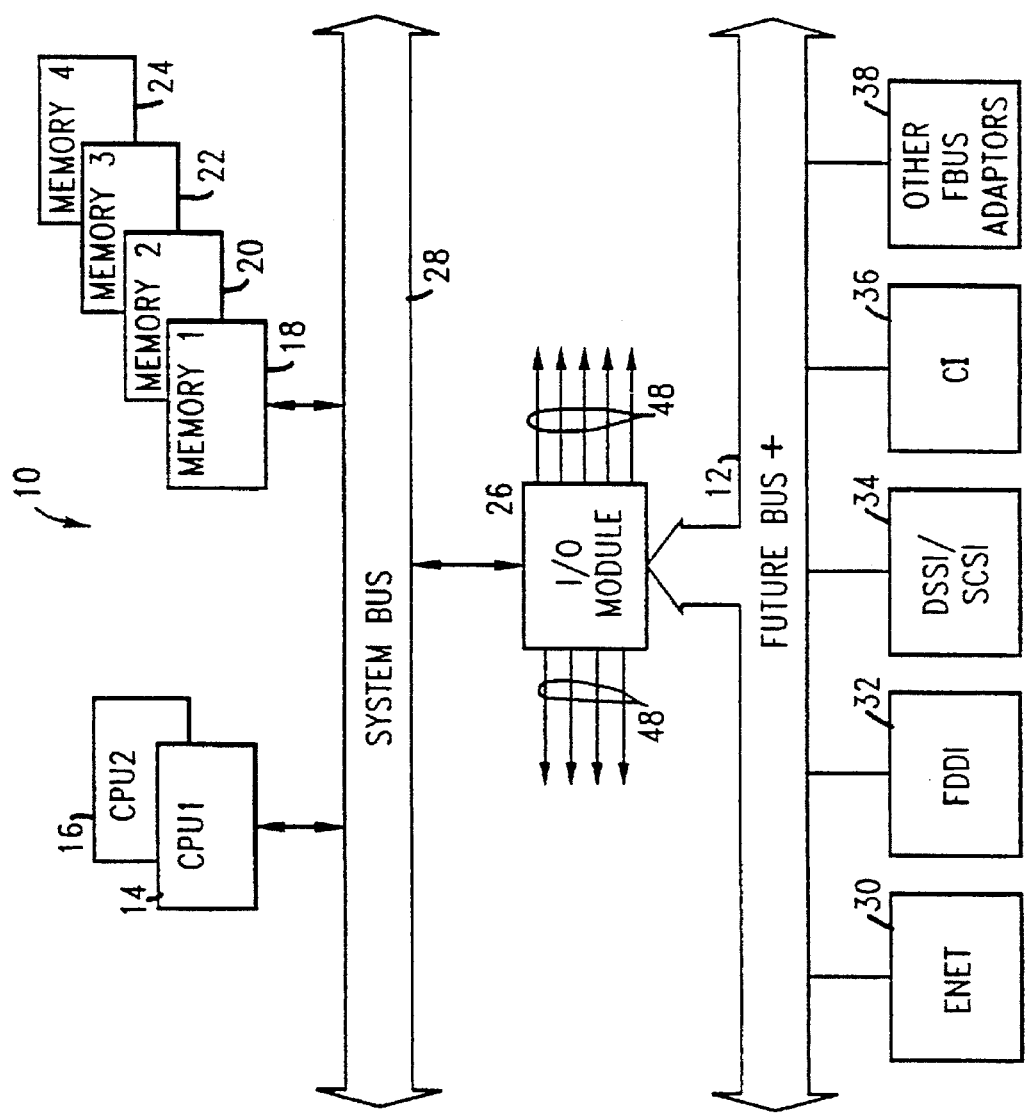
FIG. 1 illustrates an exemplary embodiment of the computer system of the present invention.

Referring now to FIG. 1, there is illustrated an exemplary computer system according to the present invention, as indicated generally by the reference numeral 10. The computer system 10 comprises a synchronous system bus 28 which is coupled to first and second CPU modules 14, 16. The system bus 28 is also coupled to first thru fourth memory modules 18, 20, 22, 24 and to an I/O module 26.

The I/O module 26 couples the synchronous system bus 28 to an asynchronous bus 12 which is designed in accordance with the Futurebus+ standard. The asynchronous bus 12 is, in turn, coupled to an ethernet ("ENET") module 30, an FDDI module 32, a DSSI/SCSI module 34 and a CI module 36. Any number of other bus adapters 38 can be coupled to the asynchronous bus 12, as may be advantageous in the operating environment of the computer system 10.

In addition to coupling the system bus 28 to the asynchronous bus 12, the I/O module 26 provides input/output lines which comprise a local bus 48 for coupling to various I/O devices (not illustrated).

Figure 2:
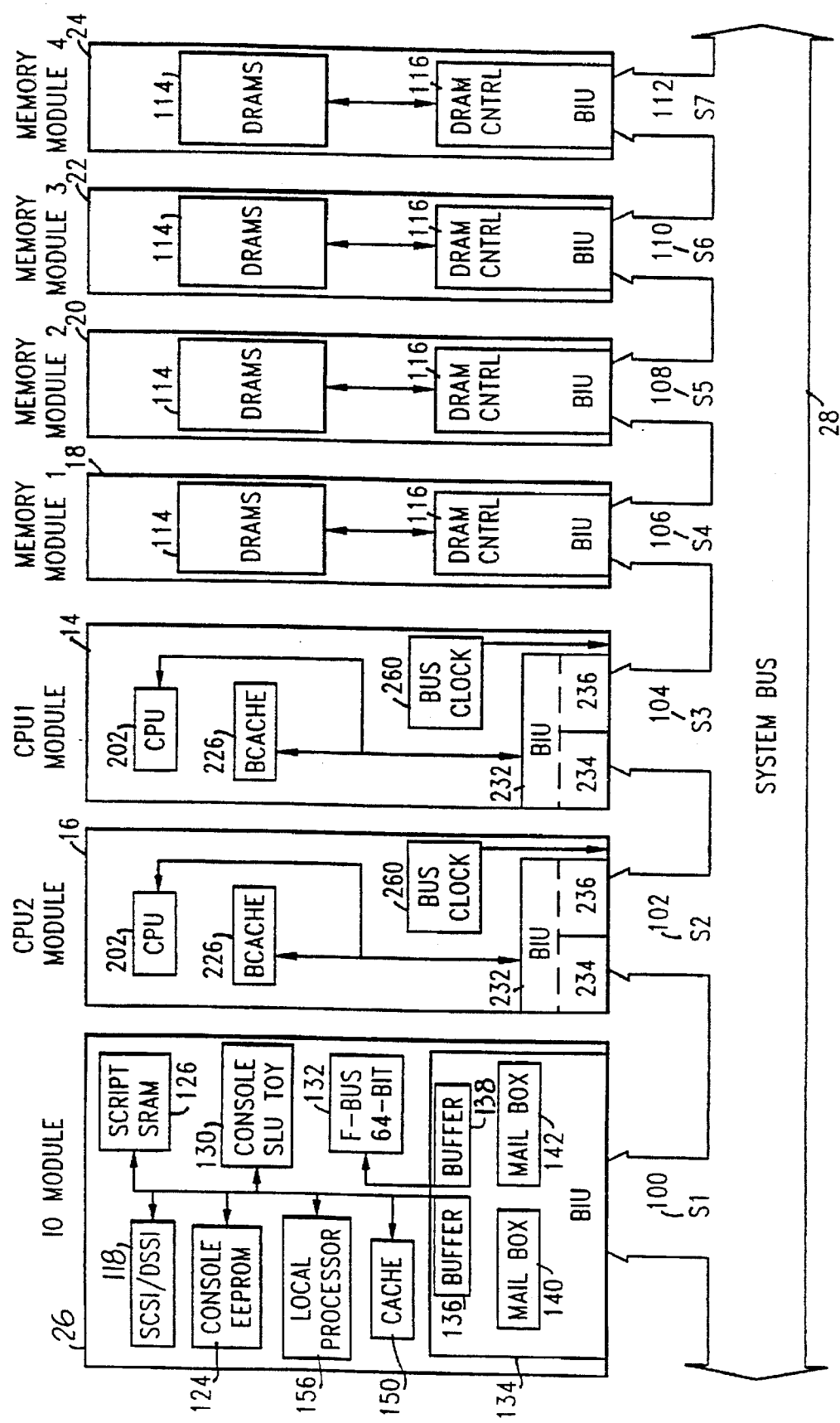
FIG. 2 is a more detailed illustration of the system bus, CPU, memory and I/O modules of the computer system illustrated in FIG. 1.

Referring now to FIG. 2, there is illustrated a more detailed schematic block diagram of the system bus 28, CPU modules 14, 16, memory modules 18, 20, 22, 24, and the I/O module 26 of the computer system 10 illustrated in FIG. 1.

The synchronous system bus 28, of the computer system 10, comprises 128 one bit address/data lines in addition to control and parity lines. These 128 one bit address/data lines are used as a multiplexed address and data path by the computer system 10.

The system bus 28 further comprises a series of seven slots S1 thru S7, 100, 102, 104, 106, 108, 110, 112 which are used to couple the computer system's modules 14, 16, 18, 20, 22, 24, 26 to the system bus 28. Each one of the computer system's modules 14, 16, 18, 20, 22, 24, 26 comprises a node on the system bus 28. A node which is capable of arbitrating for the system bus 28 and is capable of initiating a system bus transaction is refereed to as an arbitrated node.

The exemplary system bus protocol implemented by the computer system 10 supports 3 arbitrated nodes. These nodes may comprise, e.g. the two CPU modules 14, 16, and the I/O module 26. In the computer system 10, the memory modules are implemented as slave devices and are not capable of arbitrating for the system bus 28 or initiating a bus transaction.

The memory modules 18, 20, 22, 24 of the computer system 10, each comprise a block of DRAMS 114 which are coupled to a combined DRAM control and a memory module system bus interface unit 116. The computer system's available main memory comprises the total memory provided by the DRAMS 114 of the memory modules 18, 20, 22, 24.

The DRAM control and system bus interface unit 116 of each memory module 18, 20, 22, 24, is in turn coupled to the system bus 28 via the bus slots S4 thru S7 106, 108, 110, 112.

The I/O module 26 of the computer system 10 comprises a system bus interface unit 134, which is coupled to a series of other devices contained within the I/O module 26, including a disk drive interface 118, a CONSOLE serial line interface TOY (time of year) clock 130, a CONSOLE FLASH EPROM ("FEPROM") 124 and a FUTUREBUS plus interface block 132. The console FEPROM 124 may be used to store diagnostic and initialization data for use by the systems CPU modules 14, 16, as will be described below. In order to facilitate system performance, the I/O device 26 may further comprise a processor 156 and a cache 150 coupled to the I/O module's system bus interface unit 134.

The I/O module's system bus interface unit 134 comprises a first and second buffer 136, 138 and a first and second register 140, 142. The buffers 136, 138 and the registers 104, 142 referred to as "mailboxes", store data and instruction information to be used by the bus interface unit 134.

The computer system 10 provides a different buffer and mailbox pair for each bus 12, 48 which the I/O device is coupled to in addition to the system bus 28. Accordingly, the first buffer and mailbox 136, 140 are used for storing data and instruction information regarding I/O transactions on the local bus 48, while the second buffer and mailbox 138, 142 are used for storing information regarding I/O transactions on the asynchronous bus 12.

The system bus interface unit 134, of the I/O module 26 is, in turn, coupled to the system bus 28 via bus slot S1 100.

The bus protocol implemented to control data transfers over the system bus 28 is a SNOOPY bus protocol, which may also be referred to as a SNOOPING bus protocol. In accordance with this protocol, the bus interface unit of each module 14, 16, 18, 20, 22, 24, 26 on the system bus 28 monitors all bus activity looking for addresses and instructions that are relevant to any cached entries or other data that may be contained in any of the module's own internal caches or data stores, e.g. registers, as will appear.

Thus, each of the module's 14, 16, 18, 20, 22, 24, 26 coupled to the system bus 28 monitors transactions which occur over the system bus 28 and respond accordingly to maintain a state of coherency between the various data stores that exist throughout the computer system 10.

The two CPU modules 14, 16 are both physically interchangeable. However, the CPU module coupled to the system bus 28 via slot S3 104 is designated, as will be described below, by the computer system 10 as the primary CPU module 14, while the CPU module 16 coupled to the system bus 28 via slot S2 102, is designated as the secondary CPU module 16.

Both the primary CPU module 14, and the secondary CPU module 16, comprise a processor 202, a backup cache 226, a bus clock subsystem 260, and a system bus interface unit 232. The processors 202, of the computer system 10, are implemented using a 64 bit RISC architecture, referred to as the ALPHA architecture, which provides for high performance operation and the use of a very large virtual memory working space, on the order of gigabytes. Accordingly, the processors 202 of the computer system 10 may comprise ALPHA RISC processors marketed by Digital Equipment Corporation.

The processor 202 of each CPU module 14, 16 is coupled to each of the corresponding CPU module's backup cache 226 and the CPU module's system bus interface unit 232. The clock subsystem 260 and the system bus interface unit 232 are coupled to the system bus 28, via a respective bus slot S3, S2 104, 102. While each of the two CPU modules 14, 16, contain bus clock subsystems 260, only the clock subsystem 260 on the primary CPU module 14 is enabled.

The computer system 10 stores data in its backup caches 226 and main memory in 256 bit blocks referred to as data lines. Each data line may comprise data and/or processor instructions. Since the system bus 28 comprises only 128 data lines, each 256 bit line of data is transferred over the system bus 28 as two 128 bit portions, i.e., a first and second 128 bit portion of the 256 bit data line.

For efficient transfer of data to and from the CPU modules 14, 16, the system bus interface unit 232 incorporates a slicing mechanism such as the one described in U.S. patent application Ser. No. 07/874,240, entitled "Bus Interface Slicing Mechanism Allowing For A Control/Data-Path Slice" filed on even date herewith and hereby expressly incorporated by reference.

In accordance with the implemented slicing mechanism, the system bus interface unit 232 comprises two sections, a first section 234 and a second section 236, referred to as even and odd slices, respectively. Each slice 234, 236 is implemented on a single chip. Both slices 234, 236 receive all of the control information from the processor 202 which is supplied to the bus interface unit 232 but receive only one half of the data comprising each 256 bit data line to be transferred, during bus transactions.

The first slice 234, of the system bus interface unit 232, receives all the longwords, which have even addresses, of each 128 bit portion of a 256 bit data line, that is being transferred. Thus, an even data slice consists of two longwords, with each longword having an even address. Each even data slice comprises one-fourth of a 256 bit data line which is to be transferred by the system bus interface unit 232.

The second slice 236, of the system bus interface unit 232, receives all the longwords of each 128 bit portion of a data line to be transferred which have odd addresses. Thus, an odd data slice consists of two longwords, with each longword having an odd address. Each odd data slice, like each even data slice, comprises one fourth of a 256 bit data line which is to be transferred by the system bus interface unit 232.

Accordingly, the first and second 128 bit portions of a data line each comprise an even and an odd data slice. In accordance with the implemented slicing mechanism, the bus interface unit's even slice 234, handles the transfer of even data slices while the bus interface unit's odd slice 236, on the other hand, handles the transfer of odd data slices.

Figure 3A:
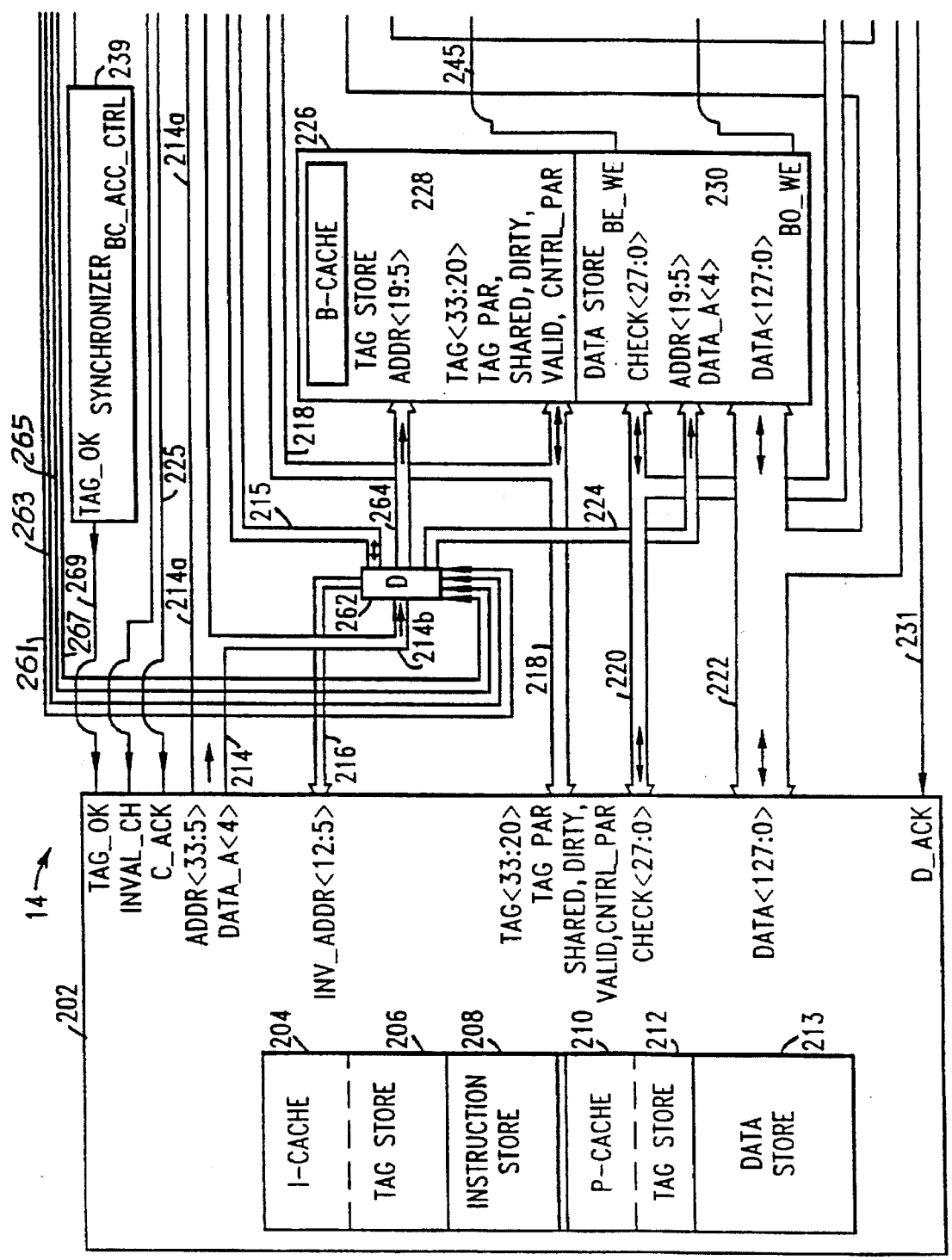
FIG. 3 illustrates a CPU module of the present invention which may be used as the first CPU module of the computer system illustrated in FIGS. 1 and 2.

Referring now to FIG. 3, there is illustrated a more detailed schematic diagram of the CPU module 14 illustrated in FIG. 2. As noted previously, the CPU modules 14, 16 are interchangeable and thus the CPU module 14, illustrated in FIG. 3, may be used interchangeably as either the primary CPU module 14 or the secondary CPU module 16 of the computer system 10 illustrated in FIGS. 1 and 2.

The CPU module 14 further comprises a multiplexer 262 arranged to couple address and control lines between the system bus interface unit 232, the processor 202, and the backup cache 226.

As noted above, the system bus interface unit 232 comprises two slices 234, 236. Each one of the two slices 234, 236 may be implemented through the use of an identical single integrated circuit chip. Thus, two identical copies of the same integrated circuit chip may be used to implement the system bus interface unit 232.

In addition to control logic, each one of the system bus interface slices 234, 236 includes an ID register 67, a control and status register ("CSR") 240, a lock register 254, a bus arbitration logic block 256 and a cache control logic block 238.

The processor 202 has several data and control terminals for the transfer and receipt of control and data information to and from the backup cache 226 and the system bus interface unit 232. An address ADDR<33:5> and DATA__A<4>, signal output of the processor 202 is coupled to a uni-directional address bus 214. The uni-directional bus 214 splits into a bus 214a for transferring the higher order bits of an address, which comprise the address TAG, and a bus 214b for transferring the lower order address bits, which comprise the cache index. The bus 214a which is coupled to a TAG address input of each slice 234, 236 of the system bus interface unit 232 comprises a series of lines which are used to supply the TAG address bits of an address being accessed by the processor 202 to the system bus interface unit 232.

The bus 214b is coupled to a cache index address signal input of the multiplexer 262. The bus 214b supplies the cache index and bit <4> of an address, which is output by the processor 202. Bit <4> of the address is used, to control and indicate which 128 bit section of the 256 bit data line is to be transferred first during a given transaction.

An INV__ADR<12:5> signal output terminal of the multiplexer 262 is coupled by a bus 216 to a corresponding INV__ADR<12:5> signal input terminal of the processor 202. An INVAL__CH signal terminal of the processor 202 is coupled by a line 250 to a corresponding INVAL__CH signal output of the bus interface unit's odd slice 236. A TAG<33:20> signal terminal of the processor 202 is coupled by a bus 218 to a corresponding TAG<33:20> signal terminal of the backup cache 226, and to a TAG <33:20> signal terminal of each slice 234, 236 of the system bus interface unit 232. Accordingly, the bus 218 is used to transfer TAG address, status, and control information between the backup cache 226, the processor 202, and the system bus interface unit 232.

A check<27:0> signal terminal of the processor 202 is coupled by a bus 220 to a corresponding check<27:0> signal terminal of the backup cache 226. Lines <20:14> and lines <6:0> of the bus 220 are also coupled to the even slice 234 of the system bus interface unit 232. Furthermore, lines <27:21> and lines <13:7> of bus 220 are coupled to the odd slice 236 of the system bus interface unit 232. The bus 220 supplies the ECC check bits, check <27:0>, to both the processor 202 and the backup cache 226. The check bits which are associated with each 256 bit line of data are used to insure the integrity of the line of data.

A DATA<127:0> signal terminal of the processor 202 is coupled by a bus 222 to a corresponding DATA<127:0> signal terminal of the backup cache 226. Lines <95:64> and lines <31:0> of the data bus 222 are coupled to the even slice 234 of the system bus interface unit 232. Lines <127:96> and lines <63:32> of the data bus 222 are coupled to the odd slice 236 of the system bus interface unit 232.

A BC__ACC__CTRL (backup cache access control) signal terminal output of the system bus interface's even slice 234 is coupled to the input of a high speed synchronizer 239 by a line 237. The output of the synchronizer 239 is coupled to a TAG__OK input of the processor 202 by a line 269.

A bi-directional cache index address bus 215 is coupled to a terminal of the multiplexer 262 and to a corresponding cache index signal terminal of each slice 234, 236 of the system bus interface unit 232.

A C__ACK (cycle acknowledgement signal) output terminal of the even slice 234 of the system bus interface unit 232 is coupled to a C__ACK input terminal of the processor 202 by a bus 225. A BE__WE (backup cache even slice write enable) signal output of the even slice 234 of the system bus interface unit 232 is coupled to a BE__WE signal input of the backup cache 226 by a line 245. A BO__WE (backup cache odd slice write enable) signal output of the odd slice 236 of the backup cache 226 is coupled to a corresponding BO__WE signal input of the backup cache 226 by a line 235.

A data acknowledgement, D__ACK, signal output of the odd slice 236 of the system bus interface unit 232 is coupled to a corresponding D__ACK signal input of the processor 202.

The even and odd slices 234, 236 of the system bus interface unit 232 are coupled together by a bus 233 to permit the exchange of error and control information between the two slices 234, 236, of the bus interface unit 232.

Figure 6:
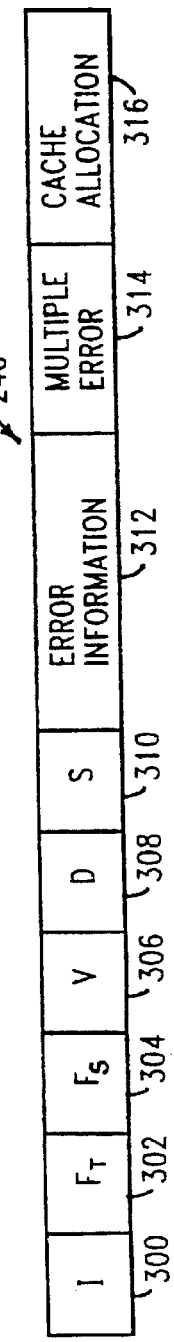
FIG. 6 illustrates an exemplary embodiment of a CSR which may be used to implant the CSR of the interface illustrated in FIG. 3.

Referring now to FIG. 6, there is illustrated an exemplary embodiment of the control status register 240 of each slice 234, 236 of the system bus interface unit 232. Each CSR 240 comprises a cache initialization control bit 300, a force TAG status control bit 302, a force TAG status shared control bit 304, a VALID value bit 306, a DIRTY value bit 308, and a SHARED value bit 310.

The backup cache initialization control bit 300, the force TAG status control bit 302, and force TAG status shared control bit 304, are written by the processor 202 to place the system bus interface, and thus the CPU module 14, 16, into various operating modes as will be described below. The VALID, DIRTY, SHARED value bits 306, 308, 310 are used to store values, supplied by the processor 202, to be written during particular system bus interface operating modes, into the TAG status fields of each cache entry accessed during the particular operating mode, as will appear.

In addition to the above control bits, each CSR 240 further comprises a cache allocation control bit 316, an error information data block 312, and a multiple error status control bit 314. The cache allocation control bit 316 is used by the system bus interface unit 232 to control the enabling and disabling of the allocation of new addresses into the backup cache 226. The error information data block 312 is used to store information regarding data errors which are detected by the system bus interface unit 232. The multiple error status bit 314 is asserted by the system bus interface unit 232 to indicate that more than one error was detected by the system bus interface unit 232.

In the multiprocessor computer system 10 of the present invention, each and every CPU module 14, 16 and processor 202 must determine its own unique identity to facilitate CPU position dependent program execution. The control logic of each CPU module's system bus interface unit 232 uses the position dependent identification information to determine whether the particular CPU module's system bus clock 260 and bus arbitration control logic should be enabled or disabled. Accordingly, bus arbitration logic and the system bus clock on the primary CPU module 14, which is coupled to slot S3 104 of the system bus 28 will be enabled, once the necessary identification information is provided to each CPU module 14, 16, while the bus arbitration logic and system bus clock will be disabled on the secondary CPU module 16.

The processor 202 of each CPU module 14, 16 uses software in conjunction with position dependent identification information to determine what control functions should be performed, e.g. hardware interrupt service, memory initialization, fault management and whether the processor 202 has primary or secondary responsibility for implementing the computer system's operating system.

As noted above, in the computer system 10 of the present invention, the CPU modules 14, 16 are interchangeable and are only distinguished from one another based on which slots of the system bus 28 the CPU modules 14, 16 are inserted. Thus, only when coupled to the system bus 28, via one of the slots S2, S3 102, 104, is a unique CPU identification number, associated with a particular slot of the system bus 28, assigned to the particular CPU module 14, 16.

The ID registers 67, of each slice 234, 236 of the CPU module's system bus interface 232, are bus accessible. The processors 202 can access the ID registers 67 on either of the CPU modules 14, 16 and uniquely determine their own ID number, which is used to identify each of the processors 202 via the following method.

During power-up or reset the I/O module 26 provides a unique signal, IO_REQ, to each one of the slots S3 104 and S2 102 which couple the CPU modules 14, 16 to the system bus 28. The primary CPU module 14 will be supplied with an IO_REQ signal with a value of logical one, via slot S3 104. However, the secondary CPU module 16 will be supplied with an IO_REQ signal with a value of logical zero, via slot S2 102. Thus, during power-up or reset, the CPU modules 14, 16 each receive a unique signal from the system bus 28 which is a function of the position, i.e. the slot, in which the CPU module 14, 16 resides.

Based on the value of the IO_REQ signal received during power-up or reset, the system bus interface unit 232, of each CPU module 14, 16, selects one of two possible values as the particular CPU module's appropriate ID and enables the bus arbitration logic and bus clock on the CPU module if the IO_REQ signal which is received is asserted indicating that the module is the primary CPU module 14. The first of the two possible values, which is selected if the CPU module receives an asserted IO_REQ signal, during power-up or reset, corresponds to the primary CPU module ID number. The second value, which is selected by a CPU module if it does not receive an asserted IO_REQ signal during power-up or reset, corresponds to the secondary CPU module ID number.

The ID value, i.e. number, selected by the bus interface unit 232 based on the value of the IO_REQ signal, is stored in the ID register 67 of each slice 234, 236 of the bus interface unit 232 of the particular CPU module's system bus interface unit 232. This stored ID number is then used as the CPU module's unique identification number.

While, after being loaded with the appropriate ID number in the above manner, the ID register 67 of each slice 234, 236 of the CPU module's bus interface unit 232, contains the identification information necessary for each processor 202 to determine its own unique position dependent identity, the system bus interface units 232 are designed so that the processors 202 can not access the ID registers 67 directly, but only via the system bus 28.

By limiting access to the CPU module's ID registers 67, to access via the system bus 28, the complexity of each CPU module's system bus interface unit 232 is reduced as compared to the known systems which provide CPUs with direct access paths to such ID registers.

Such a limitation of access to the ID registers 67, to access via only the system bus 28, normally results in the processors 202 being unable to determine their own unique identity. This undesirable result occurs since the processors 202 have access to the ID registers 67 on both the primary and secondary CPU modules 14, 16 via the system bus 28, and do not know which ID registers 67 contain the relevant ID information.

The system bus protocol of the computer system 10, used in conjunction with the ID information stored in the ID registers 67, provides a means of resolving this potential problem of position dependent CPU identification.

The SNOOPY system bus protocol provides a command address cycle which comprises a sequence of command and data signals which must be placed on the system bus 28 whenever a module on the system bus 28 initiates a bus transaction.

In accordance with the implemented SNOOPY system bus protocol, whenever a module coupled to the system bus 28 initiates a command address cycle, the bus commander, i.e. the module instituting the command address cycle, must send its own unique ID, contained in the ID registers 67 of the module's system bus interface unit 232, out over the system bus 28. The bus commander must also send the particular command being implemented and any necessary address information, associated with the command, out over the system bus 28.

The computer system 10 permits the processors 202 to determine their own unique position dependent identity through a bus read operation to the address of either the ID registers 67 contained on the primary CPU module 14 or the secondary CPU module 16.

As described above, a module's ID, which is stored in the ID register 67 of the particular module's system bus interface unit 232, is placed on the system bus 28 during the command address cycle of any bus operation. Thus, whenever a processor 202 performs a read of the ID registers 67 contained on either CPU module 14, 16 the ID number of the module initiating the read operation, i.e. the bus commander, is placed on the system bus 28.

In accordance with the present invention, when a read operation is directed to the ID registers 67 of either of the CPU modules 14, 16, the system bus interface unit 232 responding to the read operation, latches the bus commander's ID from the system bus 28 during the command address cycle.

This ID, which was latched from the system bus 28 is then returned to the bus commander, and thus the processor 202 which initiated the read operation, as a response. Accordingly, the ID information returned in response to a read of any of the ID registers 67, does not depend on the contents of the ID register 67 which is being read, but, rather on the ID of the bus commander initiating the read operation.

Thus, whenever a processor 202 attempts to determine its own unique identity via a system bus read operation to the address of one of the ID registers 67, on either of the CPU modules 14, 16, it will receive its own unique ID number as a response.

Once the processors 202 on the CPU modules 14, 16 have determined their position in the computer system 10, which corresponds to their ID numbers, by the above method, each processor 202, determines, through the use of software what position dependent code or control functions should be performed such as the providing of hardware interrupt service memory initialization, fault management and whether the particular processor 202 has primary or secondary responsibility in the operating system of the computer system 10.

The processor 202 of each CPU module 14, 16 includes an internal primary instruction cache 204 and an internal primary data cache 210. In the exemplary embodiment of FIG. 3, the primary instruction cache 204 is implemented as an 8K high speed RAM coupled to the processor 202 via a directly mapped caching scheme. Similarly, the primary data cache 210 is implemented as an 8k high speed RAM coupled to the processor 202 via a directly mapped, write through caching scheme.

The data cache 210 comprises a TAG store 212 and a data store 213. The data store 213 is divided into a plurality of addressable entries, with each entry arranged to store 256 bits of data accessed from a 256 bit location of the main memory provided by the DRAMs 114. The TAG store 212 is also divided into a plurality of addressable entries, with each TAG store entry corresponding to one of the entries of the data store 213. Each TAG store entry is arranged to store a TAG representative of the main memory address of the 256 bits of data currently stored in the corresponding data store entry, and a VALID status bit relating to the current data of the respective data store entry.

In a directly mapped cache, a portion of the main memory address of the data item, e.g., the 256 bits of data cached in the exemplary embodiment of FIG. 3, is used as an index to the location of the cache where the data item is stored. Typically, the cache index comprises a preselected number of low order bits of the main memory address. The preselected number of bits is the number of bits required to uniquely identify each addressable location of the cache data store 213. In this manner, each data item fetched from main memory for storage in the cache is stored in a cache location directly identified by the preselected low order bits of the main memory address of the data item. Thus, there is no need for an address translation to determine where a particular data item is located in the cache.

Each entry of the TAG store 212 is indexed by the same preselected bits used to locate the corresponding entry of the data store 213. The TAG stored in an entry of the TAG store 212 comprises the higher order bits of the main memory address beyond the bits used for the cache index, for the data item currently stored in the corresponding data store entry.

When the processor 202 requires a data item, it generates the main memory address for the data item. The preselected bits are used to index the data store 213 to access the data item currently stored at the indexed location. At the same time, the cache index is used to access the corresponding entry of the TAG store 212 to access the TAG.

The high order bits of the main memory address generated by the processor 202 are compared to the bits of the stored TAG. If they match, the data item stored in the accessed data store location is the data item required by the processor 202 because the main memory address of the data item required by the processor 202 is confirmed by the TAG match. If there is a match, and the VALID status bit corresponding to the particular data item is asserted, the condition is referred to as a cache "hit" since the data required by the processor 202 is located in the high speed internal primary data cache 210 and need not be fetched from the slow main memory or an intermediate cache memory, such as the backup cache 226.

If the TAG does not match the higher order bits of the address generated by the processor 202, or if the VALID status bit of the corresponding cache entry is not asserted, then the data item currently stored at the indexed location of the data store 213 is not the data item required by the processor 202. This is referred to as a cache "miss." The data item required by the processor 202 must then be fetched from main memory (or from another cache memory when there is a cache hierarchy, as is the case in the exemplary embodiment of FIG. 3 (backup cache 226), as will appear) and loaded into the primary data cache 210.

As should be understood, the TAG for the new data item is also stored in the corresponding entry of the TAG store 212. In the event of a cache miss, the processor 202 is operated to try to fetch the required data item again, after the required data item is loaded into the data cache 210, which now results in a cache hit.

Figure 5:
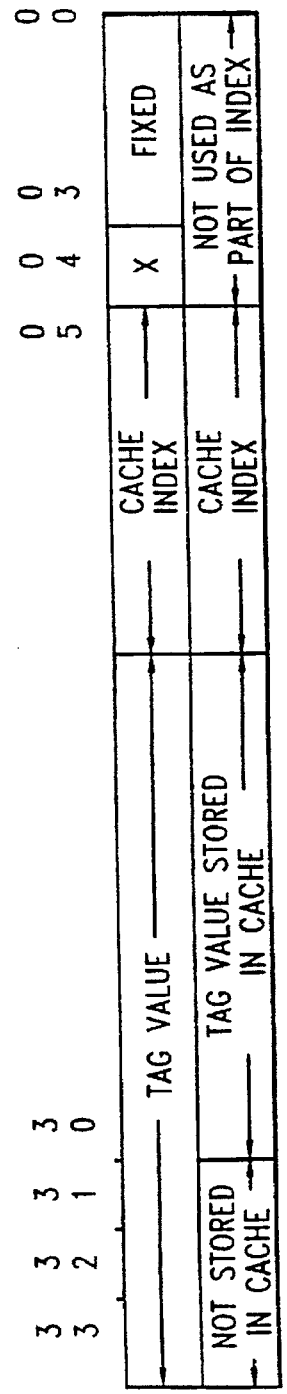
FIG. 5 illustrates the Tag and index portions of an address of the computer system 10.

The computer system 10 of the present invention uses 34 bit addresses. Referring now to FIG. 5, the upper portion of FIG. 5 illustrates how a 34 bit address of the computer system 10 may be divided into a cache index portion and a TAG portion. As described above, the cache index comprises a number of low order address bits. The number of bits which comprise the cache index will vary depending on the size of the cache implemented. For example, a 256 KB cache may have an index comprising the thirteen address bits <17:5> of the 34 bit address. However, a one megabyte cache may have a cache index comprising the 15 address bits <19:5> of the 34 bit address.

As shown in the upper portion of FIG. 5, the TAG consists of the remaining higher order bits, of the thirty four bit address, which are not part of the cache index portion of the address or the lower 5 address bits which are not used as part of the cache index.

In the computer system 10, in order to reduce the number of bits which comprise each cache index which must be used to access a cache, the five lower order bits of all cache indexes and main memory addresses may be treated as having the same fixed value. This is possible since main memory is aligned along fixed hexaword boundaries, i.e. 256 bit boundaries. Accordingly, all data lines begin at fixed hexaword boundaries and thus all data line addresses have the same five lower order address bits which need not be used as part of the cache index.

In the computer system 10, each 256 bit line of data is transferred over the system bus 28 as two 128 bit portions. Bit <4> of the 34 bit address is used in the computer system 10 to specify the order in which the two 128 bit portions of data are transferred. Thus, bit<4> of the 34 bit address is used to indicate whether the 128 bit portion received is the first or second 128 bit portion of the 256 bit line of data which is being transferred.

In a similar manner, in order to reduce the number of bits required to store each cache TAG entry, the three highest order address bits, bits <33>, <32>, <31>, of all cache entries, may each be treated as being equal to logical zero for address comparison purposes. This setting of the three highest order address bits to zero for all cache entries is possible since all cache entries are required to correspond to locations in the main memory address space which is defined by bits <33>, <32>, <31> of the 34 bit address being set to zero.

Thus, the three highest order address bits need not actually be stored in the TAG stores of the computer system 10 and are treated as logical zero for all cache entries. Accordingly, whenever a data item is stored in one of the backup caches 226 of the computer system 10, its three highest order address bits are effectively set to zero regardless of their previous value.

The bottom portion of FIG. 5, illustrates the bits of a 34 bit address which need not be stored in the TAG stores of the computer system 10 and which need not be used as part of a cache index because, as described above, all cache address have the same value for the five lowest order bits. As shown in FIG. 5 and described above, the three highest order bits of the TAG are not stored in the caches of the computer system 10, and the five lowest order address bits need not be used as part of the index for comparison purposes since they will always be the same.

The instruction cache 204 comprises a TAG store 206 and an instruction store 208. The instruction store 208 is divided into a plurality of addressable entries, with each entry arranged to store 256 bits of data comprising an instruction item, e.g. processor instructions, accessed from a 256 bit location of the main memory provided by the DRAMs 114.

The TAG store 206 is also divided into a plurality of addressable entries, with each TAG store entry corresponding to one of the entries of the instruction store 208. Each TAG store entry is arranged to store a TAG representative of the main memory address of the 256 bits of data currently stored in the corresponding instruction store entry, and a VALID status bit relating to the current data of the respective instruction store entry.

When the processor 202 requires an instruction item, it generates the main memory address for the instruction item. The preselected bits are used to index the instruction store 208 to access the instruction item currently stored at the indexed location. At the same time, the cache index is used to access the corresponding entry of the TAG store 206 to access the TAG.

If there is a "hit" in the primary instruction cache 204, it indicates that the required instruction item is located in the high speed internal primary instruction cache 204 and need not be fetched from the slow main memory or an intermediate cache memory, such as the backup cache 226.

System performance is facilitated by the use of two small internal primary caches 204, 210 as opposed to a single larger cache. Improved system performance results since less time is required to access each of the small primary caches 204, 210 than would be required to access a larger single cache. Furthermore, the division of the primary caches into an instruction cache 204 and a data cache 210 provides a logical division of the cache's contents making it easy for the processor 202 to determine which primary cache 204 or 210 to access in order to retrieve a particular type of information. For example, if the processor 202 requires an instruction item it can simply access the instruction cache 204, while the data cache 210 would be accessed if the processor 202 requires a data item.

The backup cache 226 provides a multi-level cache system for each processor 202. The backup cache 226 stores a subset of the 256 bit data items stored in the DRAM main memory of the computer system 10. The primary caches 204, 210, in turn, store a subset of the data items of the backup cache 226. Thus, when there is a cache miss for a data item in the primary cache 204, 210, the data item will be fetched from the backup cache 226 and access to the main memory will only be necessary when there is a cache miss in the backup cache 226.

The backup cache 226 comprises a TAG store 228 and a data store 230. The data store 230 is divided into a plurality of addressable data and parity check entries. Each data entry is arranged to store 256 bits of data accessed from a 256 bit location of the main memory provided by the DRAMs 114. Each parity check entry is arranged to store 28 parity bits used for detecting data errors contained in a corresponding data entry.

The TAG store 228 is also divided into a plurality of addressable entries, with each TAG store entry corresponding to one of the entries of the data store 230. Each TAG store entry is arranged to store a TAG representative of the main memory address of the 256 bits of data currently stored in the corresponding data store entry, and a set of status and parity bits corresponding to the respective data store entry. The status bits of the backup cache TAG store 228 include a VALID bit, a SHARED bit and a DIRTY bit. The parity bits include a TAG parity bit and a CNTRL_PARITY bit.

The computer system 10 uses the high speed multiplexer 262 to control access to the Tag and data stores 228, 230 of the backup cache 226. To simplify address, control and data paths to the backup cache 226 and to insure that the data and address information contained in the backup cache 226 is not altered simultaneously by both the processor 202 and the system bus interface unit 232, the multiplexer 262 limits access to each one of the data store 230 and the Tag store 228 to either the CPU 202 or the system bus interface unit 232 at any given time.

Thus, while the multiplexer 262 will permit, e.g. the bus interface unit 232 to access the Tag store 228 while the CPU is accessing the data store 230, the multiplexer 262 will not permit both the system bus interface unit 232 or the processor 202 to access the same store 228, 230 of the backup cache 226, simultaneously.

In accordance with the present invention, the system bus interface unit 232 is given access to the backup cache 226 whenever a system bus transaction requires the backup cache 226 to be probed to determine if it contains data which is relevant to an ongoing system bus transaction. If the backup cache 226 does contain relevant data, the system bus interface unit 232 is permitted to continue accessing the backup cache 226 until it has appropriately responded to the ongoing bus transaction by updating, invalidating or placing the contents of the relevant cache entry on the system bus 28 in accordance with the implemented SNOOPY system bus protocol, as will appear.

Since the system bus interface unit 232 is permitted access to the backup cache 226 during all bus transactions, as required, there is the potential that the processor 202 will be denied sufficient access to its backup cache 226 to continue making progress on whatever code it is executing during periods of heavy bus traffic.

To insure that the processor 202 is permitted sufficient access to its own backup cache 226, the computer system 10 implements a system bus arbitration scheme, as will be described below. The implemented system bus arbitration scheme is intended to prevent processor starvation, i.e. stalling resulting from the processor 202 being denied sufficient access to the backup cache 226.

The implemented bus arbitration scheme addresses the problem of processor starvation by creating periods where no bus traffic is permitted, referred to as idle cycles, in order to permit the processor 202 an opportunity to access its own backup cache 226. While each bus idle cycle consists of only a single system bus clock cycle, this is sufficient time for the processor 202, which operates at a much faster clock speed than the system bus, to access the backup cache 226 and complete a meaningful backup cache 226 data transaction.

Also, to insure that the processor 202 is not forced to give up access to the backup cache 226 in the middle of a backup cache access operation, the processor 202 is supplied with a signal, TAG_OK, from the high speed synchronizer 239. This signal TAG_OK is used to alert the processor 202, in sufficient time of an impending bus transaction which will require the processor 202 to relinquish access to the backup cache 226 for the processor 202 in processor backup cache 226 access at which the processor can be stored without the loss of data.

In the multiprocessor system 10 illustrated in FIGS. 1 and 2, wherein each processor 202 is implemented with its own cache system, it is necessary to maintain data coherency throughout the computer system 10. In other words, each processor 202, 156 (in the CPU modules 14, 16 and in the I/O module 26, respectively) must have access to the latest copy of any data item required by the processor 202. Thus, when a first processor 202 writes to a data item currently stored in its data cache 210, the data item stored in the main memory location corresponding to the just modified cached data item, will no longer be the latest copy of the data. Moreover, any copies of the data item written by the first processor 202 in the caches of the other processors 202 will also no longer be the latest copy of the data item.

The status bits stored at each TAG store entry provide a mechanism for implementing and controlling a cache coherency scheme so as to identify "stale" or invalid copies of data items and to insure access to the latest copy of any data item required by a processor 202, as will be described below.

The computer system 10 implements both write back and write through cache schemes. In accordance with a write back cache scheme, when a cache entry, i.e. a data item, is written by the processor, the write is not immediately passed through by the cache to the next memory device in the memory hierarchy. However, a DIRTY status bit corresponding to the cache entry which was modified, is asserted. Assertion of a cache entry's corresponding DIRTY status bit indicates that the corresponding data item in the cache has been modified by the processor, without the corresponding copy of the data item in main memory being updated. In order to preserve any changes made to a data item, when a DIRTY cache entry is to be replaced with another data item, i.e. victimized, the DIRTY cache entry is first written to main memory so that any changes which were made to the data item will be preserved.

As described above, the backup cache 226 is implemented as a write back cache. Thus, data coherency vis-a-vis the computer system's main memory is maintained through the use of the DIRTY status bits and the writing of DIRTY cache entries to main memory before they are victimized and thus removed from the backup cache 226.

A write through cache scheme, unlike a write back cache scheme, immediately writes any changes made to a cache entry by a processor to the next highest memory device in the memory hierarchy.

As described above, the data cache 210 is implemented as a write through cache. Thus, data coherency vis-a-vis the primary data cache 210 and the backup cache 226 is maintained by immediately passing all primary cache writes up to the backup cache 226.

The cache entries in the primary instruction and data caches 204, 210 and the backup cache 226 may be maintained in the particular cache 204, 210, 226 in various states. The status bits, associated with each cache entry via the TAG store entry, are used to indicate the state of the corresponding cache entry. The three possible states, e.g. conditions, which may be associated with a cache entry are as follows:

SHARED—If more than one module on the system bus 28 has a cache which contains a VALID copy of the given memory location.

DIRTY—A cache entry is dirty if the data item held in that entry has been updated more recently than the copy of the data item in main memory.

VALID—If the cache entry contains the latest usable copy of a memory location.

The above states, associated with the entries contained in the various caches of the computer system 10, may have to be modified to reflect data and memory transactions which occur throughout the computer system 10.

In accordance with the implemented cache scheme, whenever a cache entry is invalidated, i.e. has its VALID status bit de-asserted, the entries DIRTY and SHARED status bits are also de-asserted. Thus, in the computer system 10, an invalid cache entry will never have its corresponding DIRTY status bit asserted.

A SNOOPY system bus protocol is implemented by the computer system 10 in order to provide a scheme which will permit the various modules on the system bus 28 to monitor system bus transactions and respond in an appropriate manner to maintain the contents of their cache entries in a coherent state with the other memory devices in the computer system 10.

In accordance with the implemented SNOOPY bus protocol, all modules on the system bus 28 monitor all bus transactions. Whenever a module performs a transaction over the system bus 28, it places its own ID information on the system bus 28, in addition to the command, address and data information associated with the bus transaction being implemented. By using this information, the modules on the system bus 28 can respond to the system bus transaction by placing data on the system bus 28, by writing data to their caches or by modifying the status bits which control the state of the cache entries contained in their caches, as is consistent with the current bus transaction.

Several various types of bus transactions may occur with each module's particular response to the transaction depending on the type of bus transaction being performed, the entries contained in the module's caches and the state of those entries.

For example, when a module initiates a read operation via a system bus transaction, the bus interface units 232, 134, 116 of the other modules on the system bus 28 will monitor the transaction in accordance with the SNOOPY bus protocol. The bus interface units of the CPU modules and the I/O module 232, 134 will probe their module's caches to determine if they contain data which is relevant to the particular bus transaction. Similarly, the bus interface unit 116 of each of the memory modules 18, 20, 22, 24 will perform an address decode operation to determine if the particular memory module contains data relevant to the bus transaction.

If the read operation is to a main memory address location, a VALID copy of which is contained in another module's cache in a DIRTY state, that module whose cache contains the requested data item in a DIRTY state, as indicated by the corresponding DIRTY status bit being set, will respond to the system bus read transaction by asserting a DIRTY signal on the system bus 28 and by supplying the latest copy of the relevant data item stored in its cache to the system bus 28. Assertion of the DIRTY signal on the system bus 28 indicates to the other modules on the system bus 28, that they should not respond to the bus read transaction.

The module supplying the data will also assert the SHARED bit corresponding to the particular data item supplied to the system bus 28, and signal the other module on the system bus 28, which initiated the read operation, to assert the SHARED status bit in its cache, corresponding to the particular data item being read. Thus, the module supplying the particular data item to the bus 28 will maintain that data item in its cache in a VALID, SHARED, DIRTY state after the read transaction is completed, while the module initiating the read transaction will contain the particular data item in its cache in a VALID, SHARED state.

When a module on the system bus 28 initiates a read operation to a main memory address location, a copy of which is contained in another module's cache in a VALID, but NOT-DIRTY state, that module whose cache contains a copy of the requested data item will not place the data item on the system bus 28. The memory modules 18, 20, 22, 24, which contain the requested data item, will respond to the read transaction in the usual manner by placing the requested data item on the system bus 28. The module which contains the copy of the requested data item in its cache will, in turn, assert the SHARED status bit in its cache corresponding to the cache entry containing the requested data item, and also assert a SHARED signal on the system bus 28. Assertion of the SHARED signal on the system bus 28 indicates to the module initiating the read transaction that it should assert the SHARED status bit corresponding to its copy of the particular data item being read.

If a read to a main memory address location is initiated by a module on the system bus 28, and no other modules on the system bus 28 contain a VALID copy of the memory location in their caches, then the memory modules 18, 20, 22, 24 which contain the requested data item, will respond to the read transaction by placing the requested data item on the system bus 28. In this case, none of the other modules on the system bus 28 will respond to the bus transaction and, at the end of the read transaction, the module initiating the read transaction will have a VALID, NOT-SHARED, NOT-DIRTY copy of the requested data item in its cache.

The SNOOPY bus protocol requires that modules on the system bus 28, containing caches probe their caches to determine if they contain data which is affected by system bus write transactions as well as system bus read transactions.

In order to maintain coherency between the memory devices throughout the computer system 10, and to avoid the loss of unique data, before any DIRTY cache entries are victimized and replaced with another data item, the data item contained in the DIRTY cache entry is first written to main memory via a system bus write transaction.

System bus write transactions are also used to update main memory and maintain coherency throughout the computer system 10 in response to processor writes to a cache entry which is maintained in a SHARED state. When a processor write, to a SHARED cache entry occurs, a system bus write is used to immediately update main memory and provide the other caches in the computer system 10 an opportunity to update or invalidate their copy of the cache entry which was just modified.

In accordance with the implemented SNOOPY system bus protocol, when a cache entry is written to main memory via a system bus transaction, the modules on the system bus 28 probe their caches to determine if their caches contain a copy of the data item being written to main memory. If a module's cache contains a copy of the particular data item being written to main memory, the module either updates its copy of the data item or invalidates it, in accordance with the cache update v. invalidate policy being implemented.

In accordance with one feature of the present invention, if a module on the system bus 28 updates a SHARED cache entry, in response to a system bus write transaction, it asserts a SHARED signal over the system bus 28 to indicate that it still contains a valid copy of the particular memory location involved in the bus write transaction. However, if a module decides to invalidate its copy of the memory location involved in the bus write transaction, it does not assert the SHARED signal in response to the bus write transaction.

Modules monitoring the system bus 28 in accordance with the implemented SNOOPY bus protocol, which detect a write transaction involving a memory location which is not contained in any of the particular module's caches, as determined by probing the module's caches, do not respond to the bus write transaction.

In the above manner, the modules on the system bus 28 monitor bus transactions, probe their caches and respond to the transaction in a manner which maintains data coherency throughout the computer system 10.

The CPU's backup cache 226 contains a duplicate set of entries, corresponding to the entries contained in the primary caches 204, 210, of the processor 202. Thus, the primary caches 204, 210 contain a subset of the memory locations stored in the backup cache 226. The backup cache 226, in turn, contains a subset of the memory locations contained in the computer system's main memory.

The cache scheme implemented by the computer system 10 strictly enforces a policy of maintaining the contents of the primary caches 204, 210 as a subset of the backup cache's contents. Thus, whenever an entry is invalidated or victimized in the backup cache 226 it is always invalidated in the primary caches 204, 210.

While the primary instruction and data caches 204, 210 are incorporated into the processor 202, the backup cache 226 is located on the CPU module 14 external to the processor 202. The backup cache 226 is considerably larger than the primary caches 204, 210 and may comprise, e.g., a block of high speed RAM, of a 256K byte, 1 megabyte or 4 megabyte capacity.

Parity bits and error correction coding (ECC) bits are used as part of an error detection and correction scheme, to provide a means of insuring data and address integrity throughout computer system 10.

While a data entry for each addressable location of the caches and main memory, contains 256 bits of data, the system bus 28 comprises 128 one bit data lines. Thus, it takes two transactions to transfer a full 256 bit line of data over the system bus 28.

As described above, each of the slices 234, 236 of each system bus interface unit 232 handles the transfer, to or from the system bus 28, of one half or 128 bits of a 256 bit line of data stored in the computer system's caches or main memory. In accordance with the implemented slicing mechanism, the first control section 234 handles the transfer of half of the data line corresponding to the even numbered longwords of a line of data, while the second slice 236 handles the half of the line comprising the odd numbered longwords.

In the exemplary embodiment of the present invention, the cache control logic block 238 of each bus interface unit slice 234, 236 comprises a set of duplicate instruction and data TAG stores 242, 244, respectively. The duplicate instruction and data TAG stores 242, 244 correspond to the primary instruction and data TAG stores 206, 212 and may be accessed via the system bus 28.

While a duplicate instruction TAG store 242 is implemented in the computer system 10, such a duplicate TAG store 242 is not necessary where the entries in the instruction cache can not be written to or altered by the processors of the computer system.

As described above, both slices 234, 236 of the CPU modules system bus interface unit 232 are supplied with the same address, control and status information. Thus, the address, control and status information contained in the CSRs 240 and the duplicate Tag stores of the two system bus interface slices 234, 236 are identical.

While the duplicate TAG stores 242, 244 of the computer system 10 contain a complete copy of the address information contained in the primary caches 204, 210, they do not contain a copy of the status information contained in the TAG stores 206, 212 of the primary caches 204, 210.

The duplicate TAG stores 242, 244 of the present invention, unlike the duplicate TAG stores of known systems, contain no VALID or other status bits to indicate the validity of the contents of the corresponding line of data contained in the primary caches 204, 210. Thus the duplicate TAG stores 242, 244 corresponding to the primary instruction and data cache 204, 210 contain no DIRTY, SHARED or VALID status bits. Since no VALID status bits are stored in the duplicate tag stores of the present invention, the amount of memory required to implement the duplicate TAG stores 242, 244, is reduced, as compared to known implementations.

In accordance with the SNOOPING system bus protocol, implemented by the computer system 10 of the present invention, the DIRTY, VALID and SHARED status bits of the TAG store of the backup cache 226 are used by the bus interface unit 232 to determine the appropriate response to various bus and CPU operations. For example, when a read to a particular address is initiated on the system bus 28, and a cache contained in a module which is coupled to the system bus 28 contains the requested memory location in a DIRTY, VALID state, the module's system bus interface unit 232, is required, in order to maintain data coherency, to supply the requested data to the system bus 28 in response to the read operation.

The SHARED status bit, corresponding to a particular cache entry, which stores a particular data item, is asserted in the following manner. If, while monitoring the activity on the system bus 28, by SNOOPING on the system bus 28 in accordance with the implemented bus protocol, a first module's bus interface unit 232, 134 determines that another backup cache 226, 150 is allocating a memory location that the first module has resident in the data store of its backup cache 226, 150 then the bus interface unit 232, 134 of the first module notifies the second module that it has a VALID copy of that particular memory location in its cache 226, 150 by asserting a SHARED signal on the system bus 28.

Assertion of the SHARED signal by the system bus interface unit 232, 134 of the first module indicates to the second module, containing the second cache 226, 150, that it should allocate the memory location common to both caches in the shared state by asserting the SHARED bit in the second cache's TAG store, associated with the common memory location. The first cache, in turn, updates the status information in its TAG store 228 to assert the SHARED status bit associated with the common memory location as well.

As described above, the computer system 10 of the present invention uses the high speed multiplexer 262 to control access to the TAG and data stores 228, 230 of the backup cache 226. Under the control of the system bus interface unit 232, the multiplexer 262 limits access to each one of the data store 228 and the TAG store 230 to either the processor 202 or the system bus interface unit 232 at any given time. This permits the backup cache 226 to be implemented as a single ported cache reducing the design complexity of the backup cache 226, as compared to a dual ported cache implementation, while avoiding data coherency problems that may result from the use of a dual ported cache.

The high speed multiplexer 262, of each CPU module 14, 16, is used to switch control of access to the backup cache's TAG and data stores 228, 230 between the processor 202 and the system bus interface unit 232. The multiplexer 262 switches control over access to the backup cache 226 by selecting whether the address information supplied by the processor 202, or the address information supplied by the system bus interface unit 232, will be supplied to the TAG store 228 and the data store 230 of the backup cache 226.

When the processor 202 attempts to access the backup cache 226, the processor 202 supplies the multiplexer 262, via the bus 214b, with the cache index of an address which the processor 202 is attempting to access. Likewise, when the system bus interface unit 232 is attempting to access the backup cache 226, the tri-state bi-directional bus 215 is used to supply the multiplexer 262 with the cache index of the address location which the system bus interface unit 232 is attempting to access.

The system bus interface unit 232 is required to access the backup cache 226 in response to system bus transactions in order to determine if the backup cache 226 contains data which are relevant to the system bus transaction. Accordingly, the address supplied by the system bus interface unit 232, for access to the backup cache 226, will be the address which is read from the system bus 28 in accordance with the SNOOPY bus protocol as part of a system bus transaction.

The TAG and data stores 228, 230 of the backup cache 226 may be accessed independently and thus, it is possible for the system bus interface unit 232 to probe, i.e. access the backup cache's TAG store 228 of the backup cache 226 while the processor 202 continues to access the data store 230 to complete a backup cache transaction which was in progress at the time the system bus interface unit 232 was given access to the backup cache's TAG store 228.

In order to support the ability of the bus interface unit 232 to be able to access the TAG store 228 while the processor 202 continues to access the data store 230, the multiplexer 262 has two separate cache index outputs. The bus 264 is coupled to the first cache index output of the multiplexer 262 and to the cache index input of the backup cache's TAG store 228. The second cache index output of the multiplexer 262 is coupled to the cache index input of the backup cache's data store 230.

Based on various control signals which the multiplexer 262 receives from the bus interface unit 232, as will be described below, the multiplexer 262 selects either the cache index supplied by the processor 202 or the cache index supplied by the system bus interface unit 232 to be supplied to the cache index input of the TAG store 228 via the bus 264. In a similar manner, the multiplexer 262 selects either the cache index supplied by the processor 202 or the cache index supplied by the system bus interface unit 232 to be supplied to the cache index input of the data store 230 via the bus 224.

To control the multiplexer 262, each slice 234, 236 of the system bus interface unit 232 is coupled to the multiplexer 262 by several control lines. The odd slice 236 of the system bus interface unit 232 has a bi-directional bus address control signal, BI_ADDR_CTRL, output, coupled by a line 261 to a corresponding BI_ADDR_CTRL signal input of the multiplexer 262. During normal operation, when the processor 202 is driving addresses onto the bus 215 via the multiplexer 262, the signal BI_ADDR_CTRL is asserted. De-assertion of the BI_ADDR_CTRL signal causes the tri-state bus 215 to go tri-state, i.e., enter a high impedance state. This permits the system bus interface unit 232 to drive cache address information onto the bus 215 to be supplied to the multiplexer 262. Accordingly, the signal BI_ADDR_CTRL is asserted or de-asserted by the system bus interface unit 232, to cause the multiplexer 262 to switch the direction of the information flow, i.e. the cache address flow, on the bi-directional address bus 215.

A drive TAG address control signal, TAG_ADD_CTRL, output and an odd slice data store address control signal, O_DATA_ADD_CTRL, output of the odd slice 236 is coupled to a corresponding TAG_ADDR_CTRL signal input and a corresponding O_DATA_ADD_CTRL signal input of the multiplexer 262 by a line 263 and a line 265, respectively.

The TAG_ADD_CTRL signal is used to control whether the cache index, supplied by the processor 202, or by the system bus interface unit 232, is selected by the multiplexer 262 to be supplied to the cache index input of the backup cache's TAG store 228. When the signal TAG_ADD_CTRL is asserted, the cache index supplied by the processor 202 will be supplied to the cache signal input of the backup cache's TAG store 228.

The even slice 234 of the system bus interface unit 232 has an even data store address control signal, E_DATA_ADD_CTRL, output, which is coupled by a line 267 to a corresponding E_DATA_ADD_CTRL signal input of the multiplexer 262.

The even and odd data store control signals, E_DATA_ADD_CTRL and O_DATA_ADD_CTRL, are asserted by each respective slice 234, 236 of the system bus interface unit 232 to cause the multiplexer 262 to supply the cache index provided by the processor 202, to the cache index input of the backup cache's data store 230. However, when the signals E_DATA_ADD_CTRL and O_DATA_ADD_CTRL are de-asserted, the cache index supplied to the multiplexer 262, by the bus interface unit 232 will be supplied to the backup cache's data store 230.

In addition to the multiplexer address control signals, the system bus interface unit 232 uses a backup cache access control signal, BC_ACC_CTRL, which is output by the system bus interface unit's even data slice 234 and supplied to the high speed synchronizer 239 by the line 237, to control processor 202 access to the backup cache 226.

As described above, whenever the bus arbitration control logic 256 of the primary CPU module 14 is going to grant a module on the system bus 28 access to the system bus 28, the bus arbitration control logic block 256, first asserts a backup cache request signal, BC_REQ, over the system bus 28 to inform the modules on the system bus 28 of the pending bus transaction.

The system bus interface unit 232 of each CPU module 14, 16 monitors the system bus 28 in accordance with the implemented Snoopy system bus protocol. When the system bus interface unit 232 detects the assertion of the BC_REQ signal on the system bus 28, the bus interface's even slice 234 asserts the backup cache access control signal, BC_ACC_CTRL, which is supplied to the synchronizer 239 in order to indicate to the processor 202 that a pending bus transaction will require the bus interface unit 232 to access, e.g. probe, the backup cache 226.

In response to receiving an asserted BC_ACC_CTRL signal, the synchronizer asserts its output signal, TAG_OK, which is supplied to the processor 202 by the line 269. An asserted TAG_OK signal indicates to the processor 202 that the system bus interface unit 232 has been assigned access to the backup cache 226. Thus, the processor 202 will have to stop accessing the backup cache 226 and wait until the system bus interface unit 232 has completed accessing the backup cache 226, before the processor 202 can access the backup cache 226 again. The BC_ACC_CTRL signal, and thus the TAG_OK signal, remain asserted by the bus interface unit 232 until the bus interface unit 232 is done accessing the backup cache 226. Thus, with the de-assertion of the TAG_OK signal, the processor 202 can again access the backup cache 226.

To insure that the processor 202 is able to reach a point of data coherency, as will be described below, in any ongoing backup cache access operation before being forced to stop accessing the backup cache 226, the TAG_OK signal is asserted several CPU clock cycles before the processor 202 will be required to relinquish control of the backup cache 226 and thus be required to stop accessing the backup cache 226. The processor 202 does not check to determine if the TAG_OK signal has been asserted until it reaches a preselected data coherency point in the backup cache access operation.

As described above, the processor 202 and the system bus 28 operate at two different asynchronous clock rates. In the computer system 10, the clock speed of the processor 202 is approximately four times faster than the system bus clock speed. Accordingly, the processor 202 can perform a backup cache access operation in approximately one fourth the time required by the system bus to complete the same transaction via the system bus interface unit 232.

The processor's ability to perform backup cache operations at a much faster speed than the system bus 28, makes it possible to implement a timing scheme that insures that the processor 202 reaches a point of coherency, i.e. a point where a backup cache access operation may be halted without the loss of data and from which the access operation may be resumed when the processor 202 is once again granted access to the backup cache 226, before the processor 202 is forced to stop accessing the backup cache 226 as a result of the assertion of the TAG_OK signal.

Accesses by the processor 202 to the backup cache's TAG and data store 230 are treated as atomic operations, i.e. the access operation must be completed in one uninterrupted operation.

In the computer system 10, a processor read of a 256 bit line of data from the backup cache 226 requires a total of eight processor clock cycles. During the first four processor clock cycles of a read operation, the backup cache TAG store 228 is accessed. With the return of the information from the TAG store 228 during the fourth processor clock cycle, the processor 202 determines whether the data store 230 of the backup cache 226 contains the requested data. Accordingly, the processor 202 accesses the data store 230 to read the first 128 bits of the data line from the backup cache 226.

During the remaining four processor clock cycles, of the backup cache read operation, the processor 202 reads the remaining 128 bit portion of the 256 bit data line from the backup cache's data store 230. During these four processor clock cycles, the processor 202 does not access the TAG store 228, since it has already accessed the TAG store 228 and retrieved the necessary TAG information during the previous four clock cycles.

Thus, during the first four clock cycles of a read operation the TAG store 128 of the backup cache 226 is accessed and, if the desired data item is contained in the backup cache's data store 230, the first 128 bit portion of the 256 bit line of data that was read coincident with the TAG store 228 access by the processor 202, is in fact the desired data. During the second four clock cycles of the processor read operation, the remaining 128 bit portion of the 256 bit line is read from the data store 230, however, the TAG store 228 is not accessed during these four clock cycles.

When the processor 202 writes a 256 bit line of data to the backup cache 226 a total of 12 processor clock cycles are required. As with the read operation, the operation of writing data to the backup cache's TAG and data store 228, 230 is treated as an atomic operation, i.e. one that must be completed in a single transaction.

During the first four processor clock cycles of a backup cache write operation, the processor 202 accesses the TAG store 228 of the backup cache 226. If the processor 202 determines that the cache contains a valid entry corresponding to the write address then during the fifth processor clock cycle, the processor 202 begins accessing the data store 230 of the backup cache 226.

During the fifth through eighth clock cycle of the write operation, the processor 202 writes the first 128 bit portion of the data line to the data store 230 and writes the TAG status bits to the TAG store 228, e.g. asserts the dirty status bit corresponding to the particular cache entry being written into the backup cache 226.

After the eighth processor clock cycle, the processor 202 is done accessing the TAG store 228 as part of the write operation and has completed writing one 128 bit portion of the data line into the backup cache 226. However, another four processor clock cycles are required by the processor 202 to complete writing the 256 bit line of data into the backup cache 226. Thus, during processor clock cycles 9 through 12 of a backup cache write operation, the processor 202 writes the second 128 bit portion of the 256 bit line of data to the backup cache 226.

Since read and write accesses to the backup cache's data store 230 must be conducted as an uninterrupted transaction, the bus interface unit 232 can not be permitted to interrupt processor 202 access to the backup cache's TAG and data stores 228, 230 in the middle of a read or write transaction.

However, the bus interface unit 232 may be granted access to the TAG store 228 once the processor 202 has completed accessing it. This may occur before the processor has completed accessing the data store 230. In the computer system 10, read transactions take only four processor clock cycles to complete accessing the TAG store 228. However, write transactions take eight processor clock cycles to complete accessing the TAG store 228. To ensure that the processor 202 is not interrupted during a TAG store access, the bus interface unit 232 is required to wait a minimum of eight processor clock cycles before being granted access to the TAG store 228 of the backup cache 226 after the assertion of the TAG_OK signal.

With regard to access to the data store 230, the system bus interface unit 232 may be granted access to the backup cache's data store 230 whenever a data store access operation is not in progress, e.g. after the completion of a data store 230 access operation by the processor 202. This corresponds to the period during which the processor 202 is not accessing the data store 230, and thus may be stopped from accessing the backup cache 226. This period of time is referred to as a point of data coherency, i.e. a point where the data of the computer system's memory devices will remain coherent even if the processor's access to the backup cache 226 is interrupted.

In the computer system 10, the third processor clock cycle is the latest coherent point at which a processor backup cache access operation may be interrupted to permit the system bus interface unit 232 to access the backup cache 226. Accordingly, this point is used by the processor 202 as the point at which to check to determine if the TAG_OK signal has been asserted. If the TAG_OK signal has been asserted, the processor 202 halts the ongoing backup cache access operation before the processor 202 accesses the backup cache's data store 230. However, the processor 202 continues to assert the address of the line of the backup cache which is to be accessed, over the address bus 214.

Once the processor 202 has halted the backup cache access operation, the system bus interface unit 232 is then permitted to access the backup cache 226. Accordingly, the multiplexer 262, under the control of the system bus interface unit 232, switches control of the addresses supplied to the backup cache 226, to the control of the bus interface unit 232, i.e. the multiplexer 262 reverses the direction of the address flow on the bi-directional bus 215. The bus interface then de-asserts the TAG_ADD_CTRL/signal so the multiplexer 232 will supply the TAG store 228 with the cache index provided by the bus interface unit 232.

With the completion of the bus interface unit's access of the backup cache 226, the system bus interface unit 232 asserts the appropriate control signals to switch control of access, to the backup cache 226, back to the processor 202 and returns the state of the signals on the address buses 214, 215 to the state they were in before the bus interface accessed the backup cache 226.

During normal operation of the backup cache 226, when the system bus 28 is idle, i.e. there are no ongoing system bus transactions, the processor 202 is permitted to access the backup cache 226. Thus, during bus idle cycles, the BC_ACC_CTRL signal and thus the TAG_OK signal will be de-asserted. The TAG_ADD_CTRL signal, O_DATA_ADD_CTRL signal, and E_DATA_ADD_CTRL signal will all be asserted.

Furthermore, the multiplexer 262 will be supplying the cache index output by the processor 202 over the bus 214, to both the TAG store 228, via bus 264 and the data store 230 via the bus 224. The bus interface unit 232 will receive the TAG address information via the bus 214a and the cache index portion of the address output by the processor 202 via bus 215.

As described above, shortly before granting a module on the system bus 28, access to the system bus 28, the bus arbitration logic block 256 on the odd slice 238 of the primary CPU module 14 will assert the BC_REQ signal over the system bus 28. This causes the bus interface unit 232, of each CPU module 14, 16, to assert the BC_ACC_CTRL signal which is supplied to the synchronizer 239. The synchronizer 239, in turn, asserts the TAG_OK signal which indicates to the processor 202 that control of the backup cache 226 is about to be transferred to the system bus interface unit 232.

As described above, the processor 202 must be permitted to reach a point of data coherency in the backup cache access operation before the system bus interface unit 232 can be granted access to the backup cache 226. In the computer system 10, the third processor clock cycle of a backup cache access operation is used as the coherency point. Thus, during the third processor clock cycle of a backup cache 226 access operation, the processor checks to if the TAG_OK signal has been asserted. If it is asserted, the processor does not proceed to access the TAG and data stores 228, 230 of the backup cache 226 but instead halts the backup cache 226 access operation. However, the processor 202 continues to assert the address information on the bus 214.

At this point in time, if the bus interface unit 232 is going to access the backup cache 226, the system bus interface unit 232 will de-assert the BI_ADDR_CTRL signal which causes the bi-directional bus 215 to go tri-state. When the bus goes tri-state, the system bus interface unit 232 drives cache index addresses onto the bus 215 reversing the direction of the address information flow on the bus 215. In this manner, the bus interface unit 232 supplies the cache index of the address associated with an ongoing bus transaction to the multiplexer 262.

Shortly after the assertion of the BI_ADDR_CTRL signal, the system bus interface unit 232 de-asserts the TAG_ADD_CTRL signal which causes the multiplexer 262 to supply the cache index, supplied by the bus interface unit 232, to the cache index input of the TAG store 228.

At this time, while the system bus interface unit 232 is accessing the TAG store 228 of the backup cache 226, the processor 202 is permitted to continue accessing the backup cache's data store 230 in order to complete any backup cache data store access operation that was in progress at the time the TAG_OK signal was asserted.

The backup cache supplies the system bus interface unit 232 via the bus 218, with the TAG address and control information contained in the TAG store 228, i.e. the status information corresponding to the particular cache index, supplied by the bus interface unit 232. If, based on the results of this probe of the TAG store 228, the bus interface unit 232 determines that the backup cache 226 contains data which is relevant to the ongoing bus transaction, and which must either be updated or read out to the system bus 28 in response to the bus transaction, the system bus interface unit 232 is required to access the backup cache's data store 230.

However, if the backup cache 226 does not contain data which must be updated or read out onto the system bus 28, in response to the bus transaction, the system bus interface unit 232 need not access the backup cache's data store 230.

To access the backup cache's data store 230, after accessing the TAG store 228, the system bus interface unit 232 de-asserts the E_DATA_ADD_CTRL and O_DATA_ADD_CTRL signals. This causes the multiplexer to supply the cache index address provided by the bus interface unit 232 to the cache index input of the data store 230 via bus 224.

Accordingly, once the data store 230 is supplied with the cache index from the system bus interface unit 232, the bus interface unit 232 accesses the data store 230 as required to appropriately respond to any ongoing bus transaction.

While the BC_REQ signal on the system bus 28 may be de-asserted before the system bus interface unit 232 has completed accessing the backup cache 226, in response to a bus transaction, the control logic of the bus interface unit 232 will continue to assert the BC_ACC_CTRL signal until the backup cache access operation being conducted by the bus interface unit 232, has been completed. Thus, the synchronizer output signal TAG_OK will remain asserted as long as the bus interface unit 232 is accessing the backup cache 226 as indicated by the assertion of the BC_ACC_CTRL signal.

With the completion of the backup cache 226, access operation, by the system bus interface unit 232, the system bus interface unit 232 asserts the necessary control signals to restore the address bus 215, the bus 218, and the processor 202 to the condition they were in before the bus interface unit 232 halted processor 202 access of the backup cache 226.

Accordingly, the system bus interface unit 232 will de-assert the BC_ACC_CTRL signal and thus the TAG_OK signal. The bus interface unit 232 will also assert the BI_ADD_CTRL signal, the TAG_ADDR_CTRL signal, and the O_DATA_ADD_CTRL and E_DATA_ADD_CTRL signals.

In response to the de-assertion and assertion of the above control signals as indicated above, the multiplexer will reverse the address flow on the bi-directional bus 215 so that the system bus interface unit 232 is once again supplied with the cache index address information from the processor 202. The assertion of the TAG_ADD_CTRL signal and the O_DATA_ADD_CTRL and E_DATA_CTRL signals will cause the multiplexer to supply the cache index provided by the processor 202 to both the cache index input of the TAG store 228 and DATA store 230, respectively.

Whenever control of access to the backup cache 226 is returned by the system bus interface 232 to the processor 202, in the above manner, there is a minimum time period of one system bus clock cycle which is approximately four processor clock cycles, before which the bus interface unit 232 will be permitted to access the backup cache 226 again.

This delay period is used to restore the address, control and data buses to the state they were in before the bus interface unit 232 accessed the backup cache 226. This delay period also insures that the processor 202 will be permitted at least one complete uninterrupted backup cache access operation between every system bus transaction. Accordingly, the possibility of total processor starvation, which might otherwise result from back-to-back system bus transactions, which require the backup cache 226 to be accessed by the bus interface unit 232, is avoided.

Whenever the processor 202 attempts to read a data item from the backup cache 226, the possibility exists that the backup cache 226 will not contain the desired data item but rather another data item with the same cache index. If the data item with the same cache index, as the line the processor 202 is attempting to read, is DIRTY and VALID, that line will have to be written to main memory before the new line of data may be read from main memory and stored in the backup cache 226 as part of an exchange transaction.

In the above manner, the high speed multiplexer 262 of the present invention may be used, under the control of the system bus interface unit 232, to switch control of and access to, the backup cache 226 between the processor 202 and the system bus interface unit 232.

In the multiprocessor computer system 10 of the present invention, the system bus interface unit 232 of each CPU module 14, 16 must be able to probe the TAG stores 206, 212 of both the primary instruction and data caches 204, 210 and the TAG store 228 of the backup caches 226 of the CPU modules 14, 16 in response to transactions on the system bus 28 in accordance with the implemented SNOOPING bus protocol.

As described above, this ability to probe the TAG stores of the various caches is necessary to maintain the coherency between the contents of all the caches in the computer system 10 and the contents of the computer system's other memory storage devices including main memory. Furthermore, the ability to probe the TAG stores 206, 212, 228 permits the implementation of various schemes, including an update v. invalidate policy in respect of the entries contained in the backup caches 226.

Instead of providing a path to permit the direct probing of the TAG stores 206, 212 of the primary instruction and data caches 204, 210 contained within the processor 202, the computer system 10 utilizes the duplicate TAG stores 242, 244, contained within the CPU module's system bus interface unit 232. These duplicate TAG stores, contained in the bus interface unit 232, may be accessed from the system bus 28.

The duplicate TAG stores 242, 244 are used for two purposes. First, the duplicate TAG stores 242, 244 are used in determining when to invalidate an entry in the CPU's internal primary caches 204, 210. Second, the contents of the duplicate TAG stores 242, 244 may be considered when implementing policies to update or invalidate the contents of the CPU modules' backup caches 226 in response to a system bus write.

Since the duplicate Tag stores 242, 244 do not contain VALID status bits, all entries in the primary caches 204, 210 are assumed to be valid for purposes of implementing cache update v. invalidate policies and for decisions regarding invalidation of primary cache entries.

During bus write cycles, i.e. when there is a write transaction conducted via the system bus 28, the address associated with the write is compared with the entries in the duplicate TAG stores 242, 244. Since the computer system 10 provides no means for directly updating the primary caches 204, 210, whenever there is a match, i.e. a "hit" in one of the primary caches 204, 210, then an invalidate signal is asserted to signal the processor 202 to invalidate the corresponding primary cache entry.

Software is used to control the invalidation of entries in the primary instruction cache 204. However, hardware including the system bus interface control logic and multiplexer 262 is used to control the invalidate signal INVAL__CH. The signal INVAL__CH is asserted by the bus interface unit 232 to invalidate an entry in the primary data cache 210, whenever there is a hit of an entry contained in the data cache 210 due to write at an address broadcast on system bus 28 by another module, for example I/O module 26. In addition to the signal INVAL__CH, the relevant primary data cache address information, the signal INV__ADR<12:5>, is sent by the multiplexer 262, under the control of the bus interface unit 232, to the processor 202, whose duplicate data TAG store 244 contained the address which was hit. This causes the processor 202 to invalidate the corresponding entry contained in the primary internal data caches 210 by de-asserting the corresponding VALID status bit in the primary TAG store 212 corresponding to the entry which is to be invalidated.

As noted above, since there are no VALID bits in the duplicate TAG stores 242, 244 the control logic which is responsible for comparing the bus write address with the addresses in the duplicate TAG stores 242, 244 and generating the invalidate signals, works on the assumption that all entries in the internal caches 204, 210 are valid.

Thus, it is possible that the processor 202 may be asked to invalidate entries that have already been marked INVALID by the earlier de-assertion of the corresponding VALID bit in the internal TAG store 206, 212. For the processor 202 of the computer system 10 of the present invention, this causes no problems or noticeable degradation in performance. Thus, the need for a VALID status bit in the duplicate TAG stores 242, 244 is eliminated, and the amount of memory required to implement the duplicate TAG stores 242, 244 is reduced as compared to known systems which maintain a VALID status bit in the duplicate TAG stores.

In addition to using the duplicate TAG stores 242, 244 to determine when to send an invalidate signal to the processor 202, the duplicate TAG stores 242, 244 may be used in implementing policies regarding decisions to update or invalidate the contents of the backup cache 226, contained on the same CPU module 14, 16, as the particular primary caches 204, 210 and duplicate TAG stores 242, 244.

Such update v. invalidate policies become important whenever there is a write operation over the system bus 28 and a hit in one of the caches 204, 210, 226 of a CPU module 14, 16, that did not initiate the write operation. In accordance with the implementation of the SNOOPY bus protocol, when a write is broadcast on the system bus 28 and there is a hit in one of the CPU module's caches 204, 210, 226, the system bus interface unit 232 of that CPU module 14, 16 must decide whether to accept the new data corresponding to a particular memory location and update its copy of the memory location contained in the backup cache 226, or to change the state of its copy of the memory location to INVALID by de-asserting the respective VALID bits corresponding to the particular memory location.

Whenever a cache entry is maintained in the SHARED state, and the processor 202 associated with the cache containing the entry writes to the shared cache entry, modifying the entry and changing its status to DIRTY, the bus interface unit 232 must perform a system bus write referred to as a broadcast write to update main memory. Such a broadcast write, while updating main memory, also provides the other modules on the system bus 28 the opportunity to update any copy of the memory location that might be contained in their caches. Once the system bus write is completed, the cache entry's corresponding DIRTY status bit is de-asserted since main memory has been updated and any other copy in the caches of the computer system 10 have also been updated or invalidated.

In general, the more cache locations that are in a SHARED state, the greater the degradation in overall system performance due to the frequent occurrence of broadcast writes on the system bus 28, associated with the updating of main memory as required, whenever a data item contained in a SHARED state is modified. Thus, the update v. invalidate policies implemented with regard to the primary and backup caches of the computer system 10, are designed to minimize the number of cache entries which must be maintained in the SHARED state and thus the number of broadcast writes and backup cache updates.

The CPU module 14, of the present invention can implement two different update v. invalidate schemes for the backup cache 226. The first update v. invalidate scheme does not take into consideration the characteristic behavior of the processing element initiating the system bus write. However, the second scheme implements a separate set of update v. invalidate policies depending on whether the processing element initiating the system bus write is a processor of data, e.g. one of the processors 202, as opposed to a mover of data, e.g. the I/O device 26.

Either of the two schemes may be programmably selected via the setting of a bit in the CPU modules CSRs 240 contained in the system bus interface unit 232. Each of the CPU modules 14, 16 may be independently set to implement either one of the two schemes. This permits the update v. invalidate policy implemented by each of the CPU modules 14, 16 to be selected in such a manner as to maximize system performance by selecting the update v. invalidate scheme that provides optimal performance given a particular processor's workload.

In accordance with the first update v. invalidate scheme, when a bus write occurs, the backup caches's TAG store 228 and the duplicate TAG stores 242, 244 are probed. If the address of the bus write 'hits' in one of the duplicate TAG stores 242, 244, i.e. the address associated with the bus write matches an address contained in the duplicate TAG store, and also hits in the backup cache 226 of the CPU module 14, than the write data is accepted into the backup cache 226 updating the entry. If there was a hit in the backup cache 226 and a miss in the duplicate TAG stores 242, 244, the backup cache entry which is hit, is invalidated.

Regardless of whether or not the backup cache entry is updated, the CPU's primary internal cache entry corresponding to an address which is hit, is invalidated whenever their is a hit in the duplicate TAG stores 242, 244. Such an invalidate policy is required, with regard to the primary caches 204, 210, since no direct means are provided for updating the primary caches 204, 210 other than a read operation by the processor 202.

As noted above, since there is no VALID indicator in the duplicate TAG stores 242, 244, it is not possible to distinguish between a VALID or an INVALID entry contained in the primary caches 204, 210. Thus, for purposes of implementing an update policy regarding the backup cache 226 and an invalidate policy regarding the primary caches 203, 210, all entries in the processors primary caches 204, 210 are assumed to be valid.

This assumption, that all entries in the primary cache are valid, affects both decisions to invalidate primary cache entries and backup cache update policy decisions.

For example, a hit to an invalid entry in the primary caches 204, 210 must be treated as a valid hit when they would normally be treated as a miss. This may result, e.g., in unnecessary invalidate signals being sent to the processor 202. However, this does not affect system performance because of the processor's 202 design, which includes dual ported internal primary caches in accordance with the Alpha architecture.

The following table lists the possible combinations of conditions that can occur when the duplicate TAG stores 242, 244 and the backup cache TAG store 228 are probed.

The table further lists the update decision, in accordance with the first update v. invalidate policy:

TABLE 1

| | BCACHE | Internal Cache | Decision |
|---|---|---|---|
| 1 | Miss | Miss | No action |
| 2a* | Miss | Hit (Valid) | Invalidate internal cache entry |
| 2b | Miss | Hit | Invalidate internal cache entry |

TABLE 1-continued

| | BCACHE | Internal Cache | Decision |
|---|---|---|---|
| 3 | Hit | (Invalid) Miss | Invalidate BCACHE entry |
| 4a | Hit | Hit (Valid) | Invalidate internal cache entry; accept write data & update BCACHE |
| 4b | Hit | Hit (Invalid) | Invalidate internal cache entry; accept write data & update BCACHE |

*Note that case 2a will never occur in the computer system 10 of the present invention since the computer system 10 strictly enforces a policy requiring the contents of the primary caches 204, 210 to be maintained as a subset of the contents of the backup cache 226.

If a VALID bit had been maintained in the duplicate Tag stores 242, 244 (case 2b) the system bus interface unit 232 would not have had to send an invalidate signal to the processor 202 to invalidate the internal cache entry which was already marked INVALID. However, as noted above, the duplicate TAG stores 242, 244 of the computer system 10 of the present invention, do not contain a VALID status bit. Thus, it is necessary to send an invalidate signal to the processor 202 which contains the cache entry which was hit. While an invalidate signal is always sent to invalidate a primary cache entry which is hit, invalidation is considerably quicker than an update operation and thus, by avoiding unnecessary update operations time is saved.

As described above, software is used to control the sending of an invalidate signal to the processor 202 in the case of a hit in the primary instruction cache 204. However, when there is a hit in the primary data cache 210, the processor 202 is signaled to invalidate the primary data cache entry via the assertion of the signal INVAL_CH.

As with case 2b, in the above table, case 4b results in a different decision being implemented than would normally have been made had a VALID bit been maintained in the duplicate TAG stores 242, 244. In case 4b, a signal is asserted to invalidate the internal cache entry corresponding to the hit in the duplicate TAG stores 242, 244 and the write data is accepted by the backup cache 226 to update the entry. While both of these actions may be unnecessary, and a result of the assumption that the entry in the particular primary cache 204, 210 is valid, they do not interfere with system performance and in some cases may improve system performance.

For example, if the internal primary cache entry had become invalid due to a previous system bus write to the same address, then there is a good chance that this data will be used again in the near future by the processor 202. In such a case, accepting the data into the backup cache 226 may reduce the latency for accesses to that location in the future.

In all of the above cases, coherency is maintained throughout the computer system 10 without the need for a VALID status bit in the duplicate TAG stores 242, 244 of the computer system 10 of the present invention.

Furthermore, while reducing the memory needs to implement the duplicate Tag stores 242, 244, since no VALID bit needs to be maintained in the duplicate Tag stores 242, 244, the above approach may result in an increase in system performance as a result of updating entries which had been invalidated in the primary caches as a result of previous system bus writes, with little or no chance of performance degradation.

In order to further improve system performance, while minimizing the unnecessary updating of cache entries in the SHARED state, the computer system 10 of the present invention is capable of implementing a second update vs. invalidate policy which takes into consideration additional factors, e.g. the behavioral characteristics of the processing element initiating the system bus write, beyond those considered by the first update v. invalidate policy.

The policy decisions of this second update v. invalidate policy are based on the local state, e.g. the presence of an entry in the primary or backup caches 204, 210, 226, the design characteristics of the module containing the cache, in addition to the behavioral characteristics of the processing element, e.g. CPU or I/O controller, initiating the system bus write.

As each processing element of the various modules initiates a write transaction on the system bus 28, the processing element's characteristic behavior is transmitted over the system bus 28 via its ID (from the ID register 67) which is placed on the system bus 28, during the command cycle, along with the address and the data to be written, in accordance with the implemented system bus protocol.

If the behavior characteristic indicates that the processing element performing the system bus write is only a mover of data into and out of the computer system 10, e.g. the I/O device 26, then one set of update v. invalidate policies are implemented. However, if the processing element performing the write is a processor of data, e.g. a processor 202, on one of the CPU modules 14, 16, then a different set of cache update v. invalidate policies are implemented.

The second update v. invalidate procedure provides for optimum overall system performance since the cache management policies are not dictated only by local states, including the status and presence of the entries in the caches, but the policies also take into account the characteristic behavior of the processing device which is responsible for initiating the system bus write. Thus, this second update v. invalidate policy is normally used as the default backup cache update v. invalidate policy of the computer system 10.

As noted above, the second update v. invalidate policy implements a different update v. invalidate decision based on whether the processor 202 is responsible for initiating the system bus write or whether it is a mover of data such as the I/O module 26, that is responsible for initiating the system bus write.

The following two tables, Table 2 and Table 3, list the possible combinations of conditions that can occur when the duplicate TAG stores 242, 244, and the backup cache 226 are probed. The tables further list the update decision, in accordance with the second update v. invalidate policy, that is implemented by the computer system 10, based on the listed conditions.

As previously described, all entries in the primary caches 204, 210 are assumed valid. Thus, whenever there is a hit in one of the primary caches 204, 210, as indicated by a match between the bus write address and the address information contained in the duplicate TAG stores 242, 244, an invalidate signal, is sent to the processor 202 by the system bus interface unit 232, to cause the processor to invalidate the cache entry which was hit. Thus, regardless of the backup cache update v. invalidate policy being implemented, whenever there is a hit in one of the primary caches 204, 210, the processor 202 will be sent a signal to invalidate the cache entry which was hit.

Table 2 lists the policy decisions made when a processor of data, e.g., one of the processors 202 of the primary and secondary CPU modules 14, 16, is responsible for initiating system bus writes. Table 3, on the other hand, lists the policy decisions made when a mover of data is responsible for initiating a system bus write, such as, e.g. the I/O module 26.

For a system bus write initiated by a processor of data, the update policy is as follows:

TABLE 2

| | BCACHE | Internal Cache | Decision |
|---|---|---|---|
| 1 | Miss | Miss | No action |
| 2a* | Miss | Hit (Valid) | Invalidate internal cache entry |
| 2b | Miss | Hit (Invalid) | Invalidate internal cache entry |
| 3 | Hit | Miss | Invalidate BCACHE entry |
| 4a | Hit | Hit (Valid) | Invalidate internal cache entry; accept write data & update BCACHE |
| 4b | Hit | Hit (Invalid) | Invalidate internal cache entry; accept write data & update BCACHE |

*Note that case 2a will never occur in the computer system 10 of the present invention since the computer system 10 strictly enforces a policy requiring the contents of the primary caches 204, 210 to be maintained as a subset of the contents of the backup cache 226.

Note that the above policy decisions, for updating the backup caches 226 when a processor of data, i.e. the processor 202 of either of the CPU modules 14, 16 is responsible for initiating a system bus write, are the same as those set forth in regard to the first update v. invalidate scheme described above. Thus, the selection of the first backup cache update v. invalidate policy may be viewed as simply the disabling of the feature of the present invention which considers the characteristic behavior of the processor element initiating the system bus write and, the selection of an update v. invalidate policy which is based on the assumption that the system bus writes are being initiated by one of the processors 202 of either of the CPU modules 14, 16.

In accordance with the update v. invalidate policy of Table 2, the only time the backup cache 226 will be updated, in response to a system bus write initiated by a processor of data, is when there is a hit in one of the duplicate TAG stores 242, 244 and the backup cache 226.

Accordingly, such an update policy limits backup cache updates to situations where the processor 202, which owns the backup cache 226, is most likely to use the data again in the near future as indicated by the fact that the entry was present in one of the particular CPU module's primary caches 204, 210.

As in the above case, when the cache entry is likely to be used again in the near future, as suggested by the presence of a VALID copy of a data item in one of the primary caches 204, 210, which indicates that the processor 202 has accessed that particular data item since the last system bus write involving the particular data item, it is more efficient in terms of overall system performance, to update rather than invalidate the backup cache entry. This is true despite the fact that the entry may have to be maintained in a shared state, since another processor 202 in the computer system 10, has been accessing the line and therefore probably has a copy of the line in its cache, as indicated by the fact that the system bus write was initiated by the other processor 202 in the computer system 10.

However, in cases where the processor 202 may or may not access the particular cache entry in the near future, as indicated by a miss in both of the primary caches 204, 210, which indicates that the processor 202 has not accessed the particular cache entry since the last system bus write which involved that particular cache entry, and a hit or miss in the backup cache 226, system performance is enhanced by invalidating that cache entry so that it need not be maintained in the SHARED state. In this case, the possibility exists that a processing job has migrated from one processor of data, i.e. from one processor 202 to the other processor 202 on the other CPU module 14 or 16. In such a case, it is better to invalidate a cache entry rather than update the entry. In this manner, it is possible to avoid unnecessary system bus writes in the future which would otherwise be required whenever one of the processors 202 modified the data item contained in the particular cache entry.

Thus, the above backup cache update v. invalidate policy, which is implemented with regard to CPU initiated system bus writes, is designed to minimize the number of cache entries which must be maintained in a shared state. This has the effect of reducing the number of unnecessary system bus writes, which may occur when there are multiple shared cache entries, thus increasing overall system performance.

When it is a mover of data, e.g. the I/O device 26, which is responsible for initiating the system bus write, the update policy is as follows:

TABLE 3

|   | BCACHE | Internal Cache | Decision |
|---|--------|----------------|----------|
| 1 | Miss | Miss | No action |
| 2a* | Miss | Hit (Valid) | Invalidate internal cache entry |
| 2b | Miss | Hit (Invalid) | Invalidate internal cache entry |
| 3 | Hit | Miss | Accept write data & update BCACHE |
| 4a | Hit | HIT (Valid) | Invalidate internal cache entry; accept write data & update BCACHE |
| 4b | Hit | HIT (Invalid) | Invalidate internal cache entry; accept write data & update BCACHE |

*Note that case 2a will never occur in the computer system 10 of the present invention since the computer system 10 strictly enforces a policy requiring the contents of the primary caches 204, 210 to be maintained as a subset of the contents of the backup caches 226.

The above update policy implemented with regard to a bus write initiated by a mover of data, differs from the previous update policy which dealt with bus writes by processors of data as illustrated by case 3 in Table 3.

When a bus write is caused by a mover of data, such a write has no relevance to the issue of possible migration of a processing job from one processor 202 to another processor 202. Furthermore, a mover of data does not modify the data contained in its cache entries. Thus, a mover of data does not generate system bus writes as a result of data modifications to cache entries which are maintained in a SHARED state since no such modifications are made.

Accordingly, there is a much lower chance that a mover of data will generate a substantial number of system bus writes in the future, to update a given shared cache entry, than there is that a processor of data will generate system bus writes to update the shared cache entry in the future. In such a case, it is generally more efficient for a processor of data, i.e. the processors 202, to update a cache entry, which may be used again in the future, rather than invalidate the cache entry in response to a system bus write initiated by a mover of data, i.e. the I/O module 26.

Therefore, as illustrated in table 3, whenever a bus write hits in the backup cache 226, of the processor 202, the write data is accepted and the backup cache entry is updated rather than invalidated.

This differs from the policy implemented in regard to system bus writes initiated by processors of data, i.e. the processors 202, where for example, the backup cache entry would have been invalidated in Case 3 of Table 2, since the entry was not contained in both the primary and backup caches.

Accordingly, with the second of the two update v. invalidate policies implemented in the computer system 10, an entry in the backup cache 226 of each processor 202 will be updated whenever there is a system bus write initiated by a mover of data and a hit in the backup cache 226. Such a policy favors updating the backup cache 226, whenever there is the possibility that the processor 202 is likely to access the particular entry in the future, as suggested by the presence of the entry in the backup cache 226.

Thus, in accordance with the second backup cache update v. invalidate policy, updates of backup cache entries are more likely to occur when it is a mover of data that initiates the system bus write as opposed to a processor of data. Such a liberal update policy, in regard to system bus writes initiated by movers of data produces favorable system performance results.

The liberal update policy, with regard to system bus writes initiated by movers of data, contrasts with the stricter policy of updating the backup cache 226, in response to a bus write by a processor 202 of data, only when there is a hit in either of the primary caches 204, 210, and the backup cache 226. However, the more restrictive update policy regarding processor initiated system bus writes facilitates the policy of minimizing the number of cache entries unnecessarily maintained in the shared state and, in turn, reducing the number of broadcast writes over the system bus resulting from a need to update such cache entries.

In the interest of promoting system performance, and further reducing the number of unnecessary cache updates and system bus writes, it is desirable to be able to transition a cache line that is in a SHARED state to a NOT SHARED state whenever possible, i.e. when no other caches contain the same memory location in a VALID state. While standard cache implementations do not provide for an "UNSHARE" operation, the computer system 10 of the present invention provides a mechanism to UNSHARE a cache location and to de-assert an asserted SHARED status bit.

When a CPU module 14, 16 coupled to the system bus 28 observes a broadcast write, i.e. a system bus write transaction intended to update a location in main memory and any other copies of the memory location contained in the various caches of the computer system 10, the bus interface unit 232 must determine if the memory location being written to is contained within any of the module's primary or backup caches 204, 210, 226. As stated above, if the memory location is within the backup cache 226, the cache controller 238 contained in each slice 234, 236 of the system bus interface unit 232, must either accept the data and update the copy in the backup cache 226, or change the state of the particular cache entry to INVALID by de-asserting the VALID bit contained in the TAG store 228 in accordance with the implemented update v. invalidate policy.

As stated above, regardless of the decision whether or not to update the backup cache entry, the corresponding primary cache entry must always be invalidated whenever there is a hit in one of the primary caches 204, 210 since there is no direct way to update the primary cache other than by a processor initiated read operation.

In order to allow the broadcaster, i.e. the CPU module 14, 16 responsible for the system bus write, to update the shared state of its cache entry, all bus interface units 232 respond to the broadcast write by either asserting a SHARED signal over the system bus 28, or by not sending any signal out over the system bus 28 in response to the system bus write.

If the broadcaster detects a SHARED response, i.e. the assertion of a SHARED signal on the system bus 28 following the system bus write, the broadcaster will leave the SHARED bit in the TAG store 228 corresponding to the particular memory location asserted. However, if the broadcaster does not detect a SHARED signal response on the system bus 28, following a system bus write, it will de-assert the SHARED bit in the TAG store 228 corresponding to the particular data item which was just written to main memory, changing the state of the cache entry to NOT SHARED.

In accordance with the above process, a single unnecessary broadcast write, i.e. system bus write to update main memory and the other caches, is the most that will occur before a cache controller 232 changes the status of a cache line which is no longer shared to a NOT SHARED state. Once changed from a SHARED state to a NOT SHARED state, the data item, stored as an entry in the backup cache 226, will be treated the same as all other entries in the cache which are maintained in a NOT SHARED state.

This means that future writes by the processor 202 to the cache entry that previously had its SHARED status bit asserted, but which was de-asserted as a result of the unshare operation, will result in only the local copies, i.e. the primary and backup cache entries, being updated and the corresponding DIRTY status bit in the TAG store 228 being set. Thus, no additional unnecessary system bus writes will occur after the de-assertion of the SHARED status bit corresponding to the entry, as a result of CPU writes to that particular cache entry.

Each TAG entry in the backup cache 226 has a TAG parity bit associated with the TAG entry. Whenever a tag entry is accessed by the system bus interface unit 232, a parity check is performed. One feature of the present invention addresses the problem of handling TAG parity errors discovered in the backup cache 226 when the cache is probed by the system bus interface unit 232 in response to a bus transaction.

According to the present invention, whenever the bus interface unit 232 detects a parity error in the TAG store 228 of the backup cache 226, the allocation of cache entries into the backup cache 226 is disabled via the assertion of the cache allocation control bit 316 in the CSRs 240 of each slice 234, 236 of the bus interface unit 232. Assertion of the cache allocation control bit 16 prevents any new address locations from being written to the backup cache 226.

The allocation disabling is done automatically, as part of the normal operation of the control logic of the system bus interface unit 232. Thus, there is very little time between the discovery of a TAG parity error and the disabling of backup cache allocation. Accordingly, the latency problem in responding to such faults present with the known fault management schemes and the data coherency problems that may result are avoided.

If the TAG parity error is encountered as the result of a probe during a CPU initiated system bus transaction, backup cache 226 allocation is disabled and the requested transaction is converted by the CPU module's bus interface unit 232 into a NULL or "No-op" bus transaction, i.e. a complete bus transaction having a fixed duration of seven bus clock cycles and which does not require a response from other modules on the system bus 28. The system bus interface unit 232 also informs the CPU 202 of the occurrence of an error by asserting a HARD_ERROR signal. The HARD_ERROR signal is used to indicate the occurrence of either a parity error, which may or may not be recoverable, or the occurrence of an error resulting from a hardware fault which is sometimes referred to as a "hard error".

If the TAG parity error is detected during a system bus 28 initiated probe of the TAG store 228 in response to either a system bus READ or EXCHANGE transaction, cache allocation is disabled and the system bus interface unit 232 responds to the bus transaction by asserting the CUC_ERROR signal over the system bus 28. The responding module which contains the TAG parity error does not place the requested data on the system bus 28 even if the probe resulted in a hit of a DIRTY entry. Thus, a module on the system bus 28 will not receive potentially faulty data in response to a read or exchange type transaction and will be informed of the occurrence of an error via the assertion of the CUC_ERROR signal.

The processor 202 is informed that an error was detected by the system bus interface unit 232 by the assertion of the HARD_ERROR signal. The HARD_ERROR signal is supplied directly to the processor 202 via the bus 231. In addition, a known bad ECC is associated with the data which is returned to the processor 202 and the backup cache 226 as a result of the read or exchange operation.

If the bus initiated probe which encounters the TAG parity error is in response to a system bus WRITE transaction, the data sought to be written to the backup cache 226 is not accepted. Upon detection of the parity error, cache allocation is automaticly disabled and the processor 202 is informed of that an error was detected through the assertion of the HARD_ERROR signal.

In all of the above cases, when a PARITY error is first detected, information concerning the error is stored in the error information block 312 of each CSR register 240 of the system bus interface unit's slices 234, 236. Thus, upon receiving the HARD_ERROR signal from the bus interface unit 232, the processor 202 may investigate the error by, among other things, checking the contents of the CSRs 240 for error information.

Information on TAG parity errors which are detected subsequent to the initial TAG parity error, but before correction of the error and re-enablement of cache allocation, is not stored in each CSR's 240 error information data block 312. However, the multiple error detected bit in the CSRs 240 is asserted to indicate to the processor 202 that additional errors occurred beyond the initial error which is responsible for the error information contained in the error information data block 312 of each CSR 240. The processor 202 is made aware of any parity error which occurs, whether it be an initial parity error or subsequent parity error, by the assertion of the HARD_ERROR signal in the usual manner upon detection of the error.

The transaction upon which the parity error is first discovered leaves the backup cache 226 unaffected, i.e. the cache entry which contained the error is frozen until the processor 202 can investigate the error. No data, TAG status bits or TAG address fields, i.e. the portions of each TAG entry which contain the TAG address information, are modified as a result of the transaction. Subsequent transactions, though, may modify data and status bits of the other backup cache entries, as will be described below.

While allocation is disabled, the set of TAG address fields of the cache entries cannot be altered. However, the TAG status bits, i.e. the VALID, DIRTY and SHARED bits, associated with each TAG entry, can be modified. Any probe-related errors subsequent to the probe which first discovered the parity error, will result in the HARD_ERROR signal being supplied to the processor 202 and the assertion of the multiple errors detected bit 314 being asserted in the CSRs 240. However, no information regarding the subsequent data error is stored in the error information data block 312 of the CSRs 240 of the system bus interface unit 232.

While allocation is disabled, as the result of the detection of a TAG parity error, probes of the TAG store 28 are still permitted. However, no processor 202 or system bus 28 initiated transaction can cause the allocation of a new data item, i.e. data line, into the backup cache 226 since the contents of the backup cache's TAG fields cannot be altered.

While backup cache 226 allocation is disabled, the backup cache's responses to system bus 28 transactions and processor 202 transactions remains otherwise unchanged. For example, if a transaction would have victimized another cache entry which has no TAG parity, the contents of that particular entry are written, i.e. flushed, to main memory. However, the line which would have replaced the victim line is not written to the backup cache 226 while cache allocation is disabled and the processor 202 also does not allocate the line into either of the primary caches 204, 210 to ensure that the contents of the primary caches 204, 210 are maintained as a strict subset of the backup cache 226.

If while cache allocation is disabled, a system bus WRITE cycle occurs, the backup cache update policies described above continue to be followed. Thus, if the probe of the backup cache 226 results in a hit, the cache entry corresponding to the hit is updated in accordance with the selected update v. invalidate policy of the present invention. This assures that the data contents, of the backup cache 226 and the other data storage devices of the computer system 10, remain coherent.

If, while cache allocation is disabled, a system bus READ transaction occurs resulting in a probe of the backup cache 226 that hits an entry with good TAG parity that is marked DIRTY, the entry's data contents are forwarded to the requesting module via the system bus 28 as usual. The status of the entry is then modified to VALID, DIRTY and SHARED in accordance with the backup cache's normal operation and the SNOOPING bus protocol described above.

Thus, as described above, the fault management scheme of the present invention, allows partial use of the cache after the discovery of a TAG parity error but before the error condition has been corrected. Once the cause of the error is ascertained and corrected, e.g. by the processor 202, allocation of the backup cache 226 can be re-enabled via de-assertion of the cache allocation control bit 316 in the CSRs 240 and the clearing of the error information data block 312 and multiple error status bit 314. Once cache allocation is re-enabled, the backup cache 226 is fully functional. The re-enabling of the backup cache 226 may be implemented under software control, providing for flexibility in error handling and cache allocation re-enabling.

The above method of handling TAG parity errors provides a fast way of disabling backup cache allocation while maintaining data coherency throughout the computer system 10, without the unnecessary disruption of ongoing processes.

Upon power-up or reset, all primary cache entries will be marked INVALID by the processor 202 and thus there is no possibility that the processor 202 will attempt to use the random, meaningless data contained in the primary caches 204, 210 at that time.

The backup caches 226 of either CPU module 14, 16, upon power up or reset, may contain random data, address, and status information in the TAG and data stores of each backup cache 226. To avoid writing this "garbage data" contained in the backup cache 226, to main memory and to prevent the processor 202 from using this meaningless data contained in the backup cache 226, the computer system 10 implements a backup cache initialization procedure upon power-up or reset.

In the computer system 10 of the present invention, the maximum system memory address space and the address space supported by each CPU module's backup cache 226, support the use of upto two gigabytes of memory. However, the reserved address space of the computer system 10 is larger than the maximum allowable size for main memory. This permits the implementation of various functions and operating modes which utilize an address space outside the main memory address space.

Figure 4:
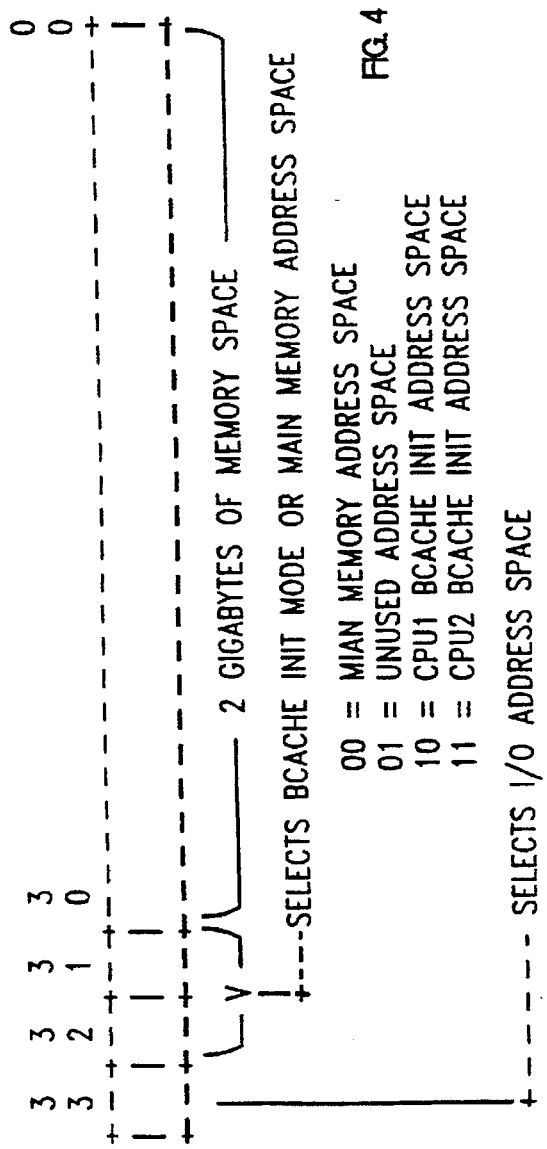
FIG. 4 illustrates the address space of the computer system of FIGS. 1 and 2.

Referring now to FIG. 4, the address space for the computer system 10 is illustrated. The computer system 10 uses a 34 bit address space with 31 bits being required to uniquely address the entire two gigabyte main memory space. As illustrated in FIG. 4, the 31 lowest orders bits, i.e. <30:0>, of the computer system's 34 bit address, are used for this purpose.

The remaining three highest order address bits, bits <33:31>, are used to identify various address spaces outside of the main memory address space. Setting of address bit 33 is used to select the I/O address space while bits 32 and 31 are used to indicate various other address spaces, as will be described.

If bits <33:31> are set to the value (0,0,0) than the main memory address space is selected. If bits <33:31> have the value (0,0,1) the address refers to an unused portion of the computer system's address space. When bits <33:31> have the value (0,1,0) then the address refers to a CPU1 BCACHE INIT address space used by the primary CPU module 14 during backup cache 226 initialization. If bits <33:31> are set to (0,1,1), then the address refers to a CPU2 BCACHE INIT address space used by the secondary CPU module 16 during backup cache 226 initialization.

Thus, each CPU module 14, 16, capable of implementing the backup cache initialization scheme of the present invention, is allocated its own unique BCACHE INIT address space.

Since the BCACHE INIT address spaces, of the computer system 10 of the present invention, are larger than the main memory address space, any arbitrary pattern can be written into the TAG field of the backup cache 226, when accessing addresses in the BCACHE INIT address space without affecting the contents of main memory. This feature of the computer system 10, may be used, e.g., for testing of the RAMS comprising the backup caches 226 or for initializing a particular cache line to a particular TAG value.

The initialization of the CPU's backup cache 226 in the computer system 10 begins with the processor 202, associated with the particular backup cache 226 which is to be initialized, sending a signal to the respective system bus interface unit 232 to enable the backup cache initialization mode. This causes the backup cache initialization control bit 300 in the CSRs 240 of the bus interface unit 232 to be set. With the setting of the backup cache initialization control bit 300, a special mode of system bus interface operation referred to as backup cache initialization mode is entered.

As long as the backup cache initialization control bit 300 is asserted in the CSRs 240, no victimized cache entries will be written to main memory. Thus, the "garbage" data contained in the backup cache 226 will not be permitted to victimize possibly good data in main memory or other backup caches 226. Furthermore, assertion of the backup cache initialization control bit 300 has the effect of forcing a cache entry's VALID, DIRTY, and SHARED status bits to values which are determined by the value of the corresponding VALID, DIRTY, SHARED value bits 306, 308, 310 contained in the CSRs 240 whenever a cache entry is probed in response to a system bus transaction.

As part of the initialization process, the processor 202 sends a signal to the bus interface unit 232 which comprises a set of values to be used when writing into a cache entry's TAG control field which contains the VALID, SHARED, and DIRTY status bits. The set of status bit values, supplied by the processor 202, is stored in the corresponding VALID, DIRTY, and SHARED value bits 306, 308, 310 of the CSR 240 of each slice 234, 236 of the system bus interface control unit 232.

During normal backup cache initialization, the set of values sent to the system bus interface unit 232 to control the setting of the cache entries VALID, DIRTY, and SHARED status bits, comprises a signal which indicates that all three status bits should be de-asserted. Accordingly, it is normal during backup cache initialization mode, for the VALID, DIRTY, and SHARED value bits 306, 308, 310 in the CSRs 240 to be de-asserted. This in turn, causes the de-assertion of a cache entry's VALID, SHARED and DIRTY status bits whenever a cache entry is accessed during backup cache initialization mode.

With the CPU module 14, 16 in the backup cache initialization mode, each processor 202 proceeds to do a series of bus reads to addresses in the CPU module's BCACHE INIT address range. The value of the lower bits of each read address are used, in accordance with the implemented cache addressing scheme, as illustrated in FIG. 5, to indicate which cache line of the backup cache 226 is to be initialized. The higher order bits of the read address determine what value will be stored in the corresponding backup cache TAG address field. As described above, the number of bits used as the cache index will vary depending on the size of each backup cache 226.

During backup cache initialization mode, as during regular operation, the address associated with a read operation is placed on the system bus 28. However, since the BCACHE INIT address range, which is unique to each CPU module 14, 16, is used, no other bus entities, i.e. modules on the system bus 28 will respond to the read operation. Since the main memory address range is not used, the read will not hit in any of the backup caches 226, 150 of the modules on the system bus 28.

Thus, none of the backup caches 226, 150 in the computer system 10 will respond to a read of a location in the backup cache initialization address range. Furthermore, the memory modules 18, 20, 22, 24 will not respond since the address being read is outside the main memory address range.

However, the system bus interface unit 232, of the CPU module 14, 16 which initiates the read operation, recognizes its own BCACHE INIT address space and returns data from a virtual status register created by the system bus interface unit's control logic. The virtual status register acts as a physical register in the sense that data may be read from it in response to reads of a given address range. However, the data returned from the virtual status register 243, indicated by dashed lines in FIG. 3. The virtual status register 243 is not read from a physical register but rather generated by the system bus interface unit's control logic.

In the computer system 10, the data returned from the virtual status register 243 in response to a bus read to a BCACHE INIT address is generated from the BCACHE INIT address associated with the read and, while the data is generated with good parity, it is otherwise meaningless.

The data returned by the virtual status register 243 in response to a read to a BCACHE INIT address may be preset to a value that is a function of the address and need not be simply meaningless data with correct ECC bits, as is the normal case in the computer system 10.

As the virtual status register 243 returns data in response to the CPU initiated bus read operation, the READ cycle completes and the backup cache 226 has the following information written to the cache entry specified by the lower order bits of the READ address which comprise the cache index:

TAG ADDRESS FIELD - written with the TAG address field bits from the read address TAG CONTROL FIELD - written with the status bit values previously supplied by the CPU 202 to the bus interface unit 232 and stored in the CSR 240

DATA ENTRY written with the data returned by the system bus in response to the bus read operation.

Once all the entries in the backup cache 226 have been initialized in the above manner, i.e. through a series of reads, e.g. to a consecutive block of addresses in the BCACHE INIT address range, the processor 202 sends a signal to the CPU module's system bus interface unit 232 to exit the backup cache initialization mode and to de-assert the backup cache initialization control bit 300 in the CSRs 240.

At the completion of the backup cache initialization mode, all of the backup cache entries will contain the data returned by the virtual status register 243 of the system bus interface unit 232 and all TAG status bits will be set to the values specified by the processor 202 at the start of the backup cache initialization mode as stored in the VALID, DIRTY and SHARED value bits 306, 308, 310 of the CSRs 240.

In the computer system 10, this means that at the end of the normal backup cache initialization procedure, the backup cache's data store will contain meaningless data items with correct parity and ECC bits associated with each entry. This permits hardware errors which might introduce errors in the data items stored in the backup cache 226 to be detected.

Thus, in the computer system 10, the TAG status bits of all backup cache entries will be set to NOT VALID, NOT DIRTY and NOT SHARED at the end of the backup cache initialization procedure. Furthermore, the backup cache's TAG entries will contain a series of addresses which correspond to the block of addresses read by the processor 202. However, since the three highest order address bits are not stored in the TAG entries of the backup cache 226, but are set to logical zero for all cache entries, as described above, the data in the backup cache 226 is treated as corresponding to main memory and not to the BCACHE INIT address space.

Using the above backup cache initialization procedure, and by varying the possible combinations of values used as the VALID, DIRTY, SHARED value bits 306, 308, 310, stored in the CSRs 240, in conjunction with reads to the reserved backup cache initialization address space, the processor 202 of each CPU module 14, 16 can arbitrarily write any combination of TAG address information, TAG status information, and data into each entry of its backup cache 226.

This ability, to initialize the backup cache 226 and its contents to any desired state, may be used for initialization purposes or by diagnostic programs as will appear.

The above backup cache initialization method permits the backup caches 226 to be initialized without the need for special data flows or paths. Except for the fact that the address range used for backup cache initialization purposes is decoded to a special virtual status register by the receiver, i.e. the control logic of the CPU module's bus interface unit 232, there is no difference between the response required by the modules on the system bus 28 to a bus read operation during the backup cache initialization mode and during normal operational mode.

Furthermore, since all other modules on the system bus 28 ignore these bus read operations because each CPU module 14, 16 has its own BCACHE_INIT address space, initialization of multiple backup caches 226 contained on the different CPU modules 14, 16, can occur simultaneously without problems of interaction between modules on the system bus 28.

In accordance with one feature of the present invention, the backup cache 226 may be utilized to mimic, i.e. used in place of, main memory through the use of a special BCACHE as Main Memory Operational mode which is entered into by the setting of a force TAG status control bit in the CSRs 240. In this mode, it is possible for the backup cache 226 to be loaded with data and instruction information from the system bus 28 via system bus writes without the need for a conventional memory subsystem. Once the backup cache 226 is loaded with the desired data, the processor 202 may then read, execute and modify the instruction and data information loaded into the backup cache 226 without ever having to access main memory. Thus, it is possible for the processor 202 to execute code even when the computer system's main memory is not functional.

The backup cache 226 may be used to mimic main memory by first configuring the backup cache 226, in accordance with the implemented backup cache update v. invalidate scheme, (described herein with reference to Table 2 and Table 3) to update cache entries that hit in the backup cache 226 when system bus writes occur.

A hit in the backup cache 226 can be insured by presetting the backup cache's TAG entries to preselected values to which the system bus writes can then be addressed to insure a hit. Furthermore, by setting the status of the backup cache entries to a particular value determined, by the implemented backup cache update v. invalidate policy and the system bus protocol, e.g. DIRTY and VALID, both an update of the backup cache entry can be ensured as a result of the system bus write operation, and it can also be insured that the contents of the backup cache 226 will be used to respond to future bus read operations in accordance with the implemented SNOOPY bus protocol.

Thus, the proper setting of the status bits, e.g. the assertion of the DIRTY and VALID status bits, insures that the data contained in the backup cache entries will be provided by the system bus interface unit 232 in response to any future bus read operations, directed to the address locations contained within the backup cache 226.

To set the TAG address and status bits to the desired values, the backup cache initialization procedure, described above, may be used. However, rather than setting the cache entries VALID, SHARED and DIRTY status bits to NOT VALID, NOT SHARED, and NOT DIRTY, the processor 202 supplies a signal at the beginning of the cache initialization procedure, which is used to assert the VALID, SHARED, and DIRTY status value bits 306, 308, 310 contained in the CSRs 240 of the bus interface unit 232.

Accordingly, upon completion of the cache initialization procedure in preparation for use of the backup cache 226 to mimic main memory, the cache's TAG entries address will contain preselected address information and the cache entries status bits will be set to VALID, SHARED, and DIRTY. Once the TAG values and the backup cache status bits are set in the above manner, a signal may then be sent to a module on the system bus 28, e.g. the I/O module 26, to institute a series of system bus writes which are used to load the backup cache 226.

Once the system bus writes have updated the backup cache 226, and the entries are marked DIRTY and VALID, any system bus reads that hit in the backup cache 226 will result in the cache's contents being supplied to the system bus 28 in response to the read operation, in accordance with the implemented system bus SNOOPY protocol. Thus, the backup cache 226 may be used to mimic main memory eliminating the need for the main memory subsystem.

The mimic main memory ability of the computer system 10 is used by the computer system 10 in the following manner, to load and execute diagnostic code without exposing the code stream to possible faults in the computer system's main memory.

Prior to entering the BCACHE as Main Memory mode, the CPU module's backup cache is initialized in the manner previously described. Thus, once initialization is completed, the backup cache 226 contains preselected address, TAG and status information which was loaded into the backup cache 226 during the initialization procedure.

After the backup cache 226 is initialized, the processor 202 sends a signal to the CPU module's bus interface unit 232 initiating entry into the BCACHE as Main Memory mode.

The processor 202 need not send a signal to the bus interface unit 232 indicating the values to which the VALID and DIRTY status bits are to be set since the VALID, DIRTY, and SHARED value bits 306, 308, 310 will remain asserted as a result of the backup cache initialization procedure.

Setting of the force TAG status control bit 302 enables a function which has the effect of forcing the VALID, DIRTY and SHARED status bits, contained in a cache entry's corresponding TAG status bits, to the values indicated by the VALID, DIRTY, and SHARED value bits 306, 308, 310 in the CSRs 240.

In accordance with the second backup cache update v. invalidate policy, which is implemented as the default setting in the computer system 10, any system bus writes which hit in the backup cache 226 will be updated since the cache entries VALID, DIRTY and SHARED status bits are set as a result of the backup cache initialization procedure.

With the backup cache store initialized to preselected values and the backup cache entries status bits set to VALID and DIRTY, the processor 202 sends a signal to the I/O device 26 to proceed with a series of system bus writes to the addresses which were previously loaded into the backup cache 226 as part of backup cache 226 initialization.

The I/O device 26 then writes a block of diagnostic code to the same address space to which the backup cache was initialized. The addresses and corresponding data are accepted by the backup cache 226 in accordance with the implemented update v. invalidate policy. The backup cache 226 updates the contents of the cache entries with the diagnostic code being supplied via the system bus writes initiated by the I/O device 26. As the backup cache entries are updated with the diagnostic code, the corresponding DIRTY and VALID status bits for each entry will remain asserted since the force TAG status control bit remains asserted.

Once the diagnostic code is written to the backup cache 226 in the above manner, future system bus reads to the address locations will result in the cache contents being supplied in response to any read operation, in accordance with the system bus protocol, since the cache entries are marked DIRTY. Furthermore, in accordance with the implemented write through cache policy, of the primary caches, future write operations by the processor 202 to an address located in the backup cache 226 will result in the backup cache entry being updated.

When the processor 202 determines that it should exit BCACHE as Main Memory mode, the processor 202 sends a signal to the system bus interface unit 232 to de-assert the force TAG status control bit 304 in the CSRs 240 after which, normal operation of the CPU module 14, 16 resumes.

The above mechanism, for permitting the backup caches to mimic main memory, permits code to be executed without being exposed to main memory hardware faults. Such a mechanism, which permits diagnostic code to be stored in non-volatile RAM on a slow computer subsystem, e.g. the I/O device 26, and yet permits the diagnostic code to be executed without exposure to main memory system hardware faults, provides significant advantages over the known systems which store the diagnostic code on the CPU module or which require operation of the computer systems main memory to permit execution of diagnostic code.

The computer system 10 of the present invention implements a method of flushing dirty lines from the caches contained on the various modules of the computer system 10 during normal system operation without having to change the operational behavior of the backup caches 226. To flush the backup cache 226 of each CPU module 14, 16, the computer system 10 uses a region in the system's address space outside of main memory's address space, refereed to as "ALLOCATE INVALID SPACE". This region, ALLOCATE INVALID SPACE, operates as a region in the computer systems's address space that is treated as cache-able, i.e. when processor 202 accesses to this address space occur, the backup cache's TAG store 228 is checked and the operation may result in data being stored in the backup cache 226.

However, in accordance with the implemented cache update protocol, any cache entry that is allocated into the backup cache 226 via an access to the ALLOCATE INVALID SPACE region will be marked NOT VALID by the de-assertion of that particular cache entry's VALID status bit. Thus, when a processor 202 performs a read to the ALLOCATE INVALID SPACE region, the resultant data that is returned and stored in the backup cache 226 will be marked INVALID. The data returned to the processor 202 is also marked INVALID to enforce the policy of the computer system 10 that the contents of the primary caches 204, 210 be maintained as a strict subset of the contents of the backup cache 226.

In accordance with the normal operation of the write back cache policy implemented by the computer system 10, any DIRTY cache entry that is to be victimized as a result of a read operation, is first written to main memory, i.e. flushed.

Accordingly, the processors 202 of each CPU module 14, 16 can use this feature of the computer system's normal operating behavior to flush a cache line at any time by simply reading a line in the ALLOCATE INVALID SPACE memory region with an index that matches the index of the cache line which is to be flushed. In this manner, the processors 202 may flush the entire contents of their backup caches 226 through a series of reads to address locations in the ALLOCATE INVALID SPACE memory region with indexes that correspond to the backup cache's indexes.

To permit the processor 202 to flush the entire backup cache 226 in this manner, the ALLOCATE INVALID SPACE region must be defined large enough so that, for the largest cache in the computer system 10, the processor 202 can go through and victimize all possible locations in any cache by reads to the ALLOCATE INVALID SPACE region.

For example, if a computer system implemented a one megabyte cache, the ALLOCATE INVALID SPACE region required to flush such a cache would have to be at least one megabyte in size.

In the computer system 10, as described above, various cache sizes are supported. As illustrated in FIG. 4, the addresses used in the computer system 10 comprise a total of 34 bits. The main memory address space of the computer system 10 is defined as follows:

| | | |
|---|---|---|
| address bits <33:31> | = | 000 |
| address bits <30:0> | = | (actual address of memory location in main memory) |

Note that only the lower 31 bits of the 34 bit address are required to access the entire two gigabyte main memory address space. As described above, in order to avoid the unnecessary storage of address bits <33:31> in the backup caches 226, these address bits are treated as logical zero for all cache entries and are not stored in the TAG stores of the backup caches 226.

In order to support the flushing of a cache with a 31 bit address, i.e. the maximum cache address size in the computer system 10, the ALLOCATE INVALID SPACE region must be have an address space comprising at least 31 bits. Furthermore, as noted above, the ALLOCATE INVALID SPACE region must be located outside of the computer system's main memory address space.

To met the above requirements, any of the address bits <33:31> may be used to define an ALLOCATE INVALID SPACE region sufficiently large, and outside of the main memory address space, to support the flushing of a cache with a 31 bit address space, i.e. a cache with upto 2 gigabytes of addressable memory. To simplify the implementation of the above flushing method, it is preferable to select a single bit in the address to designate the ALLOCATE INVALID SPACE region.

In an exemplary embodiment of the present invention, the computer system 10 defines the ALLOCATE INVALID SPACE region to be that address region which may be addressed when bit <31> of the 34 bit address used by the computer system 10 is set. Thus, whenever a read to an address with bit <31> set occurs, the system bus interface units 232, of either CPU module 14, 16, who's processor 202 initiates the read operation, recognizes the read as an operation involving the ALLOCATE INVALID SPACE region of the computer system 10.

When an address within ALLOCATE INVALID SPACE is read, probing the backup cache 226 will result in a miss because no TAG entry in the backup cache 226 will have address bit 31 set, since all the TAG entries in the backup caches 226 of the computer system 10 have the 3 highest order bits <33:31> set to logical zero, as described above. As a result, the cache entry whose cache index matches the corresponding lower-order address bits of the location being read is thus guaranteed to be victimized when the data from the read to ALLOCATE INVALID SPACE is stored in the backup cache 226. Thus, by reading from ALLOCATE INVALID SPACE a contiguous block of locations the same size as the cache to be flushed, each entry in the cache is guaranteed to be victimized.

When a cache entry is victimized, as described above, it is replaced with the victimizing entry read from the ALLOCATE INVALID SPACE. If a cache entry to be victimized is marked DIRTY, its contents are first written, i.e. flushed, to main memory. The old cache entry is then replaced with the data returned from the read of ALLOCATE INVALID SPACE and the particular cache entry is marked INVALID. Thus, the corresponding VALID status bit of the entry written into the backup cache 226 is de-asserted to indicate that the new entry is INVALID.

In the above manner, it is possible to partially or completely flush a cache, depending on how many different locations are read in the ALLOCATE INVALID SPACE region where each read flushes one backup cache entry.

In accordance with one feature of the present invention, when the ALLOCATE INVALID SPACE region is addressed by the CPU modules 14, 16, the CPU module's system bus interface units 232, translate the requested address into an address within the main memory space before placing the address on the system bus 28 as part of any bus operation. In the exemplary embodiment of the computer system 10, this consists of clearing address bit 31.

Thus, the data read into the backup cache 226 when a location in ALLOCATE INVALID SPACE region is read, is that data which resides at the location in main memory that has the same lower 31 address bits. In this case the actual data read into the backup cache 226 is not important since it will be marked INVALID. This address translation, from an address in the ALLOCATE INVALID SPACE region to an actual main memory address, eliminates the generation of address requests on the system bus 28 which are directed to invalid memory locations outside of the computer system's main memory space. This avoids the need for any special control flows or bus protocol definitions which might otherwise be required to respond to such reads.

Since the flushing scheme of the present invention operates during normal system operation, it is possible for a normally executing software routine to cause cache entries that were just flushed to become DIRTY before the flush routine has completed flushing the backup cache 226.

In order to permit the backup caches 226 to be flushed and have no DIRTY cache entries remaining at the completion of the cache flush operation, the computer system 10 utilizes the SNOOPING bus protocol in conjunction with the ability of the computer system 10 to force cache entries to be allocated in the SHARED state via the assertion of the force TAG status control bit 304 in the CSRs 240.

To insure that no cache entries are in a DIRTY state at the time the cache flush is completed, the processor 202, implementing the cache flush, may set the force TAG status SHARED control bit 304 in the CSR 240 of each slice 234, 236 the CPU module's system bus interface unit 232, to force all cache accesses which could change the state of the cache entry being accessed, to result in the assertion the SHARED status bit associated with the particular cache entry being accessed.

In accordance with the writeback cache policy and the SNOOPING bus protocol implemented by the computer system 10, any accesses to backup cache entries during such a flush operation when the force TAG status shared control bit 304 is asserted, which would result in a cache entry being marked DIRTY, will result in the cache entry being written out to main memory as a result of the entries being set to the SHARED state. Thus, a write to a backup cache entry during this flushing mode will result in a broadcast write, i.e. a system bus write to update main memory. After the cache entry is written to main memory, the cache entry's DIRTY status bit which was asserted as a result of the processor write is de-asserted. In this manner, any entries which are marked DIRTY after being previously flushed, will be flushed again to main memory as a result of the broadcast write which occurs due to the SHARED state of the cache entry. Accordingly, when the cache flush is complete, no cache entries will be in a DIRTY state.

With the completion of the cache flush operation, the force TAG status SHARED control bit 304 which forces the accessed cache entries to be allocated in the SHARED state, may be de-asserted by the processor 202 thus permitting normal backup cache 226 allocation to resume.

Several synchronization problems may arise with regard to system bus transaction synchronization. For example, synchronization problems arise when a system bus operation is aborted by the system bus interface unit 232. The system bus protocol implemented by the computer system 10 of the present invention, requires a module which has arbitrated for and been awarded access to the system bus 28, to complete a bus transaction. A NULL or no-op bus operation, which is defined as having a fixed length of 7 bus clock cycles which is equal to the longest non-error bus transaction possible without stalls, has been provided as part of the system bus protocol. The NULL operation which involves a complete bus transaction provides a mechanism which a system bus interface unit 232 may use to complete a bus transaction and relinquish control of the system bus 28.

The NULL operation may be used, e.g., to relinquish control of the system bus 28 after a module on the system bus 28 has arbitrated for access to the system bus 28, been awarded control of the system bus 28 and then is unable to, or no longer interested in, completing a meaningful bus transaction.

Accordingly, the NULL operation may be used in cases where the bus interface unit 232 recognizes after arbitrating for the bus, based on the address associated with a given command, that a meaningful bus transaction is not required to complete the requested transaction. In such cases, the requested operation is transformed by the system bus interface unit 232 into a NULL bus type transaction.

In accordance with the implemented bus protocol, the NULL operation is performed by sending the NULL command in conjunction with an address out over the system bus 28. The NULL operation provides for the optional placing of a line of data out on the system bus 28 during the NULL operation. This permits a module on the system bus 28 to write out and read in a line of data on the system bus 28 during a NULL operation, without interference from other modules on the system bus which do not interact, in accordance with the implemented bus protocol, with the bus activity during the NULL operation.

In order to provide a means of synchronization of processes working on a common task or accessing a common memory location, the computer system 10 of the present invention implements a synchronization scheme using the lock registers 254, contained within each slice 234, 236 of the CPU module's system bus interface unit 232, the NULL bus operation, and the CPU's load memory data into integer register locked ("load-lock") and store integer register data into memory conditional ("store-conditional") instructions as provided for in accordance with the processor's Alpha architecture.

The load-lock and store-conditional commands may be used for the synchronization of atomic operations performed on the contents of a particular memory location located at an address specified by the processor 202. Atomic operations, comprise, e.g, read then write operations that cannot be successfully completed if another processor modifies the contents of the memory location before the first processor 202 successfully completes the operation on the particular memory location.

The processor 202 initiates an atomic operation with a load-lock command which is sent to the CPU module's bus interface unit 232 along with the address of the memory location to be accessed.

This causes the CPU module's bus interface unit 232 to initiate a system bus read operation in order to load the contents of the memory location to be accessed into the backup cache 226. As a result of this bus read operation, the lock registers 254 are loaded with the address of the memory location to be accessed and the corresponding VALID status bit contained in each lock register 254 is asserted.

Upon receipt of the load-lock command, the system bus interface unit 232 initiates arbitration for access to the system bus 28 while checking the backup cache TAG store 228 to determine if the address is already contained within the backup cache 226 as one of the cache entries.

Frequently, the case may exist that a VALID, and sometimes DIRTY copy of the memory location to be accessed is already contained in the backup cache 226 of the processor 202 which is initiating the atomic operation. In such a case, it is not necessary for a system bus read operation to be completed. However, to ensure synchronization and avoid the loss of unique data, the bus interface unit 232 completes arbitration for the bus. The bus interface unit 232 dynamically converts the load-lock read operation into a NULL bus operation to avoid re-allocation of a valid cache line. In asserting the NULL bus operation, the bus interface unit 232 asserts the NULL command and sends the address of the line to be accessed, along with the corresponding data contained in the particular cache entry, out over the system bus 28.

In this manner, the VALID line of data is read out of the backup cache 226 and written to the system bus 28 as though being exchanged with another line of data from main memory. The data is then read back into the system bus interface unit 232 and written into the backup cache 226 loading the lock registers 254 with the relevant address information and causing the VALID status bit in each lock register 254 to be set.

Thus, the system bus 28 is used in the usual manner to load the lock registers 254 even when the line to be accessed is already contained in the CPU's backup cache 226. The above procedure insures that the lock registers 254, which are accessible from the system bus 28, are loaded with the address of the line being accessed and that the VALID status bit in each of the lock registers 254 is set. Reading the data line out of the backup cache 226 and then back into the backup cache 226 avoids the need to implement special data paths within the bus interface unit 232 for the loading of the lock registers 54. In this manner, the address and data paths of the bus interface unit 232 required to load and validate the lock register 254 are simplified.

This permits the simplification of the address and data paths contained within the CPU module's bus interface unit 232 and avoids the need to otherwise implement a bi-directional merge buffer and a dual ported register file in the system bus interface unit 232 and permits the use of a uni-directional merge buffer and a single ported register file instead.

Once the backup cache 226 is loaded with the line which is to be accessed; each one of the load lock registers 254 is loaded with the address of the line being accessed; and the VALID status bit in the load lock register 254 is set; the processor 202 proceeds with its atomic operation.

With the setting of the VALID status bit in each one of the load lock registers 254, the CPU module's bus interface unit 232 monitors the system bus 28, in accordance with the SNOOPING bus protocol, to determine if any write operations, to the line whose address is stored in the lock register 242 occur. If a write to the line, whose address is stored in the load lock register occurs the VALID status bit in each of the load lock registers 254 is de-asserted. However, unlike write operations, read operations directed to the address contained in the lock register 254 do not effect the value of the lock register's status bit. However, a "hit" as the result of a read to an address contained in the load lock registers 254, with the associated valid bit contained in the load lock registers 254 set, will result in a SHARED signal response being asserted on the system bus 28 even if the line in the backup cache 226 has been marked INVALID.

When the processor 202 completes the atomic operation it is performing on the line of data whose address is contained in the lock registers 254, the processor 202 executes a store-conditional operation in order to write the results of the atomic operation to memory. The bus interface unit 232 arbitrates for access to the system bus 28 upon receiving the store conditional instruction from the processor 202. Once the bus arbitration request is completed and the CPU module's system bus interface 232 has been given access to the system bus 28, a dynamic decision is made by the bus interface unit 232 to complete the store operation and write the information to main memory or to fail the store operation and thereby perform a NULL bus operation.

The system bus interface unit 232 proceeds to check if the VALID bit in each of the lock registers 240 is still asserted indicating that the particular memory location was not written to during the time the processor 202 performed the atomic operation. If the VALID bit in each of the lock registers 254 is asserted, then the store conditional requirement is satisfied and the results of the atomic operation are written to main memory.

However, if the VALID bit in each of the lock registers 254 is not asserted it indicates that the contents of the address in the lock register 254, was written to during the time the processor 202 performed the atomic operation. This causes the store-conditional operation to fail and, as noted above, a NULL bus operation is performed. In such a case, the processor 202 is left to retry the atomic operation at another time, since the particular attempt was unsuccessful.

Since the processor 202 is left to retry the operation at a later time, no bus protocol retry operation needs to be implemented. The above mechanism preserves memory coherency while, at the same time, avoiding bus synchronization problems through use of the NULL bus operation.

Thus, use of the load-lock and store-conditional operations, in the above manner, makes synchronization of processes accessing a common memory location or working on a common task possible. Furthermore, unlike the known synchronization mechanisms, the above mechanism does not lock out all other processors 202 from main memory while an atomic operation is being performed. As a result, unlike the known mechanisms, the synchronization mechanism of the present invention does not consume excess bus bandwidth or CPU time since other processors 202 in the computer system 10 are permitted access to both main memory and the system bus 28, in accordance with the implemented bus arbitration scheme, throughout the period during which any of the processors 202 of the computer system 10 are performing atomic operations.

The synchronization mechanism described above, can be used to perform dynamic scrubbing of soft memory errors, e.g. errors which are not the result of a hardware fault, without creating data or coherency problems.

Since main memory can be read and re-written without concern for data coherence and synchronization issues, the load-lock and store conditional operations are utilized to scrub soft memory errors without bringing all system processors 202 and processes to a suspended state as is normally done in the known systems.

When a soft memory error is detected, the computer system's memory controller, i.e. the memory module's DRAM control and system bus interface unit 116, signals to one of the processors 202 that a soft memory error has occurred at a particular address. The processor 202 responds to the soft error signal by initiating a load-lock operation.

Accordingly, the line in main memory which contains the soft error is read from main memory into the CPU module's backup cache 226, the lock registers 254 are loaded with the address of the line which contained the soft error as a result of the load-lock read operation, and the VALID bit in each one of the lock registers 254 is set.

As a result of the read operation, the soft error is corrected in accordance with the implemented error detection and correction scheme. With the correction of the soft error, the processor 202 proceeds with the store-conditional operation.

If the VALID bit in the lock registers 254 is still asserted when the store-conditional operation is executed, the line is written back into main memory scrubbing the soft error.

However, if the VALID bit in each of the lock registers 254 is not asserted when the store-conditional operation is executed, the store conditional operation will fail the write operation and be converted into a NULL bus operation. While, the de-assertion of the VALID bit in each of the lock registers 254 causes the store conditional operation to fail, it indicates that the line at the address stored in the lock register, i.e. the line with the soft error, was overwritten by a write to that memory location since the load-lock operation was commenced.

Thus, whether the store-conditional operation is able to successfully complete the write operation and write the line to main memory, or it fails because the memory location is overwritten as a result of a write operation initiated by another module on the system bus 28, the soft error is scrubbed form memory.

In the above manner, soft errors may be scrubbed from main memory without bring all processors 202 and processes in the computer system 10 to a suspended state.

In addition to the above uses, the store-conditional operation may be used as a multi-process flow control mechanism. For example, in the computer system 10 of the present invention, the store-conditional operation is used to control the flow of commands to shared command hardware registers, e.g. the mailbox registers 140, 142 on the I/O device 26, without the need for hardware FIFO queues or a bus retry protocol.

In accordance with one feature of the present invention, the implemented bus protocol, in conjunction with the store-conditional operation, is used to regulate the flow of new commands into the hardware command registers 140, 142 or "mailboxes" contained on the I/O device 26.

When initiating an I/O operation, the processor 202 attempts to write the address of a memory location containing the I/O commands to the command registers 140, 142 on the I/O device 26. Since the addresses of the registers 140, 142 are outside the address range for main memory, these write operations do not effect either main memory, the contents of the computer system's caches, or the contents of the lock registers 254.

If the write operation to the registers 140, 142 is successful then no signal is sent back by the I/O module 26. The lack of a response from the I/O device 26 indicates that the store conditional operation has succeeded and the CPU module's system bus interface unit 232 signals to the processor 202 that the write to the I/O device 26 was successful.

However, if the registers 140, 142 are already full, and therefore can not accept the write data, the I/O module's system bus interface unit 134 asserts the signal CUC_ERROR on the system bus 28. The assertion of the signal CUC_ERROR indicates to the CPU module's system bus interface unit 232 that the write operation to the I/O device 26 has been unsuccessful and that the store conditional operation has failed. The system bus interface unit 232 detects the CUC_ERROR signal response and signals to the processor 202 indicating that the store conditional operation was unsuccessful and that the processor 202 must retry the operation at a later time.

In this manner, the store-conditional operation in conjunction with the implemented bus protocol provides a means for facilitating multiprocessor and multi-process flow control for a shared hardware command register 140, 142. Since the processor 202 is informed of the failed write attempt to the command register 140, 142, as described above, the processor 202 is left to retry the operation at a later time thus avoiding the need to implement hardware FIFO queues or a bus retry protocol.

Frequently, the processor 202 will perform a read operation to a line which is not contained within its backup cache 226. Such a read operation requires that the requested line be read from main memory and then written into the processor's backup cache 226. Such an operation may result in a VALID cache entry in the backup cache 226 being victimized.

If the victim cache entry is marked both DIRTY and VALID, in order to maintain coherency, the line of data comprising the victim cache entry must first be written to main memory before the new line of data may be read from main memory and written into the CPU's backup cache 226. Such an operation requiring the exchange of data between the CPU module 14, 16 and the computer system's main memory is referred to as an exchange type transaction.

In order to minimize both the time required to perform an exchange type transaction and the amount of bus bandwidth required by such a transaction, the system bus protocol implemented by the computer system 10 of the present invention, supports an exchange transaction protocol which does not require the full address of both the line which is to be stored in main memory and the line which is to be read from memory, to be transmitted over the system bus 28.

During the command cycle of an exchange type transaction, there is an address field and an exchange address field, which are sent out over the system bus 28 as part of an exchange command. The memory modules 18, 20, 22, 24, which contain the given address locations, return the data item referenced by the "address field" while storing the data item referenced by the "exchange address field".

In the computer system 10 of the present invention, 34 bit addresses are used. The "read address" contained in the address field and the exchange address contained in the exchange address field each have a common index. Thus, the exchange address need not include the common index and so the number of bits that comprise the exchange address may be less than the number of bits which comprise the address contained in the address field.

The combined DRAM control and system bus interface units 116 of the memory modules 18, 20, 22, 24 form the full exchange address by concatenating the index bits, of the address contained in the address field, to the exchange address.

Thus, in any command cycle, the address field contains the full address:

(HIGHER_ORDER_ADDR*INDEX), and if there is an exchange address, the exchange address field contains only the high order exchange address bits:

(EXCH_ADDR).

As described above, the combined DRAM control and system bus interface units 116 of the memory modules 18, 20, 22, 24 form the full exchange address as follows:

full exchange address=(EXCH_ADDR*INDEX).

The above address translation is true only if all the CPU modules 14, 16 of the computer system 10 have the same size backup caches 226 and thus the same size cache indexes.

However, as described above, each of the CPU modules 14, 16 can be independently configured, with the backup cache 226 on one CPU module 14, 16 being larger or smaller than the backup cache 226 on the other CPU module 14, 16. Accordingly, the number of bits which comprise the index to each CPU module's backup cache 226 may be different depending on the size of the cache implemented.

In order to provide support for an exchange type transaction while permitting multiple backup caches 226 of various sizes to co-exist on the system bus 28 without restricting exchange functionality, the system bus protocol defines the size of a cache index, for purposes of an exchange transaction, as being defined as the number of bits required for an index to a cache that is the minimum size cache allowable for a backup cache in the computer system 10 where each cache size increment uses another address bit for the cache index.

In the computer system 10, the minimum size backup cache 226, which is permitted, is a 256 KB backup cache. In accordance with the above exchange protocol, the size of the cache index for purposes of a system bus transaction is defined by the bus protocol to be the number of bits required as the index to a 256 KB cache which, in the computer system 10, is the minimum size allowable for a backup cache 226.

Figure 7:
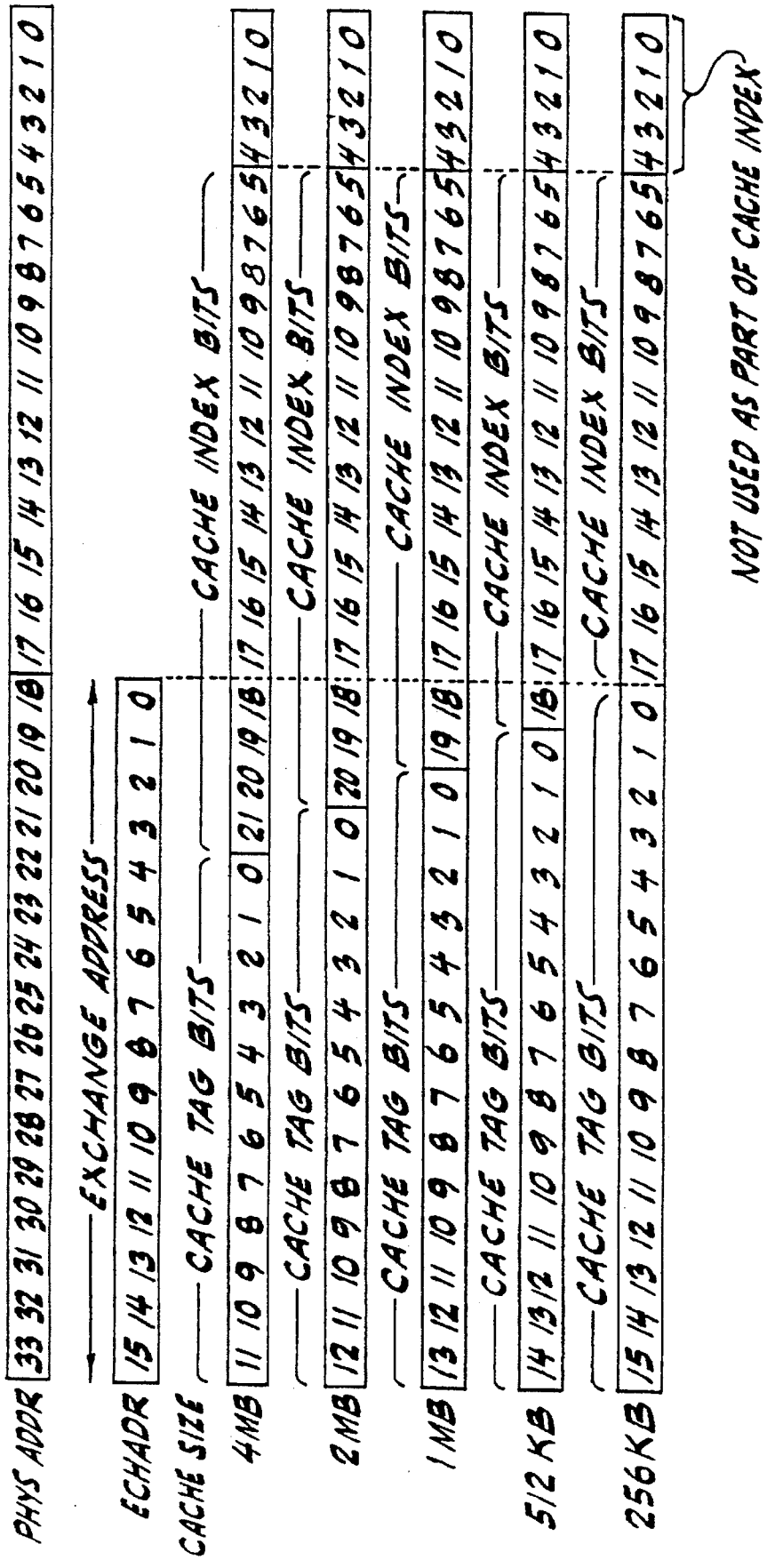
FIG. 7 illustrates the cache and index portions of addresses associated with various size caches in the computer system 10.

Referring now to FIG. 7, the address bits which correspond to the TAG and Index fields of various size caches, e.g. a 256 KB thru 4 MB size cache, are shown. The physical address (PHYS ADDR) illustrated corresponds to the 34 bit addresses used by the computer system 10. As described above, the lower 5 bits, i.e. bit 0 thru bit 4, of the 34 bit address need not be stored or used as part of the cache index since the computer system 10 stores data at predetermined hexaword, i.e. 256 bit, boundaries within main memory.

As illustrated in FIG. 7, the TAG and INDEX fields of a cache address corresponding to a 256 KB cache, i.e. the minimum backup cache size permitted in the computer system 10, each comprises 13 bits. As illustrated, for a 256 KB cache, the cache INDEX comprises the 13 lower order bits of the physical address which are used, i.e. bits 5 thru 17 of the full 34 bit address, while the TAG field consists of the 16 higher order address bits, corresponding to bits 18 thru 33 of the 34 bit address.

For a larger size cache, the index will comprise a greater number of the lower order address bits and, thus the TAG field will be smaller. For example, as shown in FIG. 7, a 1 MB cache would have an index comprising 15 bits while the TAG field would comprise only 14 bits.

While the actual number of bits which comprise a backup cache index will vary depending on the size of the implemented backup cache 226, the index size will be fixed for purposes of an exchange transaction in accordance with the implemented exchange protocol. Thus, the index size in the computer system 10 is defined, for system bus 28 exchange transactions, as comprising bits 5 thru 17 of the full 34 bit address, i.e. the bits used to index a 256 KB cache.

By defining the index size as fixed for purposes of system bus exchange type transactions, the address translation procedure of the present invention remains constant and does not depended on the individual CPU module's backup cache size.

In order to support the above protocol, the system bus interface unit 232 of each CPU module 14, 16 must translate the exchange addresses used within the CPU module 14, 16, which may vary depending on the size of the CPU module's backup cache 226, so that they conform to the implemented system bus protocol which treats cache indexes as being 18 bits in size. To make the cache addresses conform to the implemented system bus protocol, if the TAG field of the implemented cache is less than 16 bits, the lower bits of the EXCHANGE address, which are not used to hold the TAG field bits, must be filled using the higher order bits of the corresponding cache index. Thus, as illustrated in FIG. 7, as the backup cache size increases, a larger number of exchange address bits must be filled in from the corresponding high order cache index bits, as represented by the shaded bits shown in FIG. 7.

Since, in the above manner, the size of the index is fixed by the system bus protocol for exchange type transactions over the system bus 28, for any module on the system bus 28, including the memory modules 18, 20, 22, 24 the full exchange address translation is always as follows:

full exchange address=(EXCH_ADR*index).

The exchange transaction and address translation method described above and implemented by the computer system 10, provides an efficient means of conducting an exchange type of transaction over the system bus 28. Furthermore, the above method of conducting an exchange transaction is independent of the size of the backup caches 226 in the computer system 10.

The above exchange transaction may be used as part of a masked write operation being conducted on a line of data not contained in the CPU's backup cache 226 at the time the transaction was initiated.

In the computer system 10, the masked write type of operation involves a masked write of a longword of a data line, i.e. a longword from among the 32 longwords of a 256 bit line of data. When the masked write operation is to a line of data which is not in the CPU's backup cache 226, at the time the operation is initiated, the line must be read from main memory.

After reading the line of data from memory into the backup cache 226, the processor 202 modifies it by performing the masked write on the line of data. Then, in accordance with the implemented system bus protocol, if the line is maintained in the CPU's backup cache 226 in a SHARED state, the CPU module's bus interface unit 232 proceeds to write the modified line of data, which is marked DIRTY, out to main memory via a system bus write.

If the read operation, which occurs as part of a mask write operation, victimizes a backup cache entry which is marked DIRTY, that entry must first be written to main memory in an exchange type transaction before the masked write operation may proceed.

Because the CPU module's system bus interface unit 232 immediately arbitrates for access to the system bus 28 upon receiving a masked write command, in some cases, the bus access request may be granted before the bus interface unit 232 is ready to perform the bus transaction. Such a timing problem may arise with regard to arbitration for the system bus 28 when a modified write operation involving an exchange transaction immediately follows a system bus write transaction. This timing problem may arise since it takes the system bus interface unit 232 a relatively long time to complete responding to a system bus write transaction, because of the time required to implement the computer system's backup cache update v. invalidate policy, the bus interface unit 232 may not have sufficient time during a masked write operation, following a bus write transaction which requires updating of the backup cache 226, to read the masked write data from the processor 202 and the victim data from the backup cache 226 in time to respond to a grant of access to the system bus 28.

The normal response to a grant of bus access under such a circumstance would be to implement a NULL bus transaction, since control of the system bus 28 cannot be released without conducting a bus operation and the bus interface unit 232 is not yet ready to perform a meaningful bus transaction. However, in the case of a masked write operation, such a response to the bus grant would result in wasted bus bandwidth and unnecessary delay in completing the masked write operation. Such an undesirable result would normally occur since the bus interface unit 232 will be required to first wait for the NULL transaction to complete and then have to request access the system bus 28 a second time so that it can perform the required exchange transaction.

In such a case, the computer system 10 of the present invention, reduces the amount of wasted bus bandwidth and prevents the unnecessary delay associated with having to re-arbitrate for the system bus 28 by asserting a STALL signal on the system bus 28 as opposed to conducting a NULL transaction.

In accordance with the system bus protocol implemented by the computer system 10, a STALL does not have any fixed minimum duration, thus, the bus interface unit 232 need only assert the STALL signal until it is prepared to complete the exchange bus transaction. Thus, in this case, a STALL will be shorter in terms of duration, than a NULL transaction which has a fixed duration defined as 7 bus clock cycles in the computer system 10 of the present invention. Implementing a STALL has the further advantage of permitting the bus interface unit 232 to retain control of the system bus 28 until it is prepared to complete the exchange transaction required by the masked write operation. Performance of a NULL transaction, on the other hand, requires that control of access to the system bus 28 be relinquished at the end of the transaction requiring the bus interface unit 232 to re-arbitrate for the system bus 28 when it is prepared to complete the exchange transaction.

Thus, by asserting a STALL signal as opposed to performing a NULL transaction, the amount of wasted bus bandwidth is minimized, since the STALL will be shorter in terms of duration than a NULL operation would last. Furthermore, an additional bus arbitration cycle is avoid further reducing the amount of time was required to complete the exchange transaction required by the masked write operation.

In the computer system 10 of the present invention, system bus arbitration and synchronization problems are resolved by the system bus arbitration logic block 256 contained in the odd slice 236 of the primary CPU module's system bus interface unit 232.

The bus arbitration logic block 256 of the odd slice 236 of the primary CPU module's bus interface unit 232 receives requests to access the system bus 28, from the various modules coupled to the system bus 28. Access to the system bus 28 is granted by the bus arbitration logic block 256, to a requesting module, in accordance with a bus arbitration scheme that is intended to maximize overall system performance, as will be described below. In addition to having the ability to grant access to the system bus 28, the bus arbitration logic block 256 of the odd slice 236 of the primary CPU module, has the capability of inserting one or more idle bus cycles, where each idle bus cycle comprises a bus clock cycle during which no module on the system bus 28 is granted access to the system bus 28.

As described above, whenever a bus transaction occurs, the backup cache 226 of each processor module 14, 16, must be probed to determine if the backup cache 226 contains data that is relevant to the ongoing bus transaction. In the computer system 10, each backup cache 226 is single ported and thus may be accessed by only one device at a time. Thus, when the processor 202 is accessing its backup cache's TAG store 228, the TAG store 228 of the backup cache 226 may not be probed by the CPU module's system bus interface unit 232 in response to a bus transaction. Similarly, if the TAG store 228 is being accessed by the CPU module's system bus interface unit 232 as a result of a system bus transaction, the processor 202 will be denied access to the backup cache 226.

Thus, the processor 202 "owns" the backup cache 226 while accessing its backup cache 226. However, the system bus 28 owns the backup cache 226 during the time period when the system bus interface unit 232 must access the backup cache 226 due to bus transactions. The multiplexer 262 is used, in conjunction with the bus arbitration logic blocks 256, to control access to the backup cache 226 between the processor 202 and the system bus 28.

The arbitration scheme implemented by the logic block 254 of the primary CPU module's odd slice 236, addresses two degrees of potential processor starvation, the first is near total or total processor starvation, where the processor 202 is denied any significant access to its backup cache 226 for a period of time. The second degree of processor starvation which is addressed, is partial processor starvation, which occurs when the processor 202 is permitted some access to its backup cache 226, but is denied sufficient access to make adequate progress in executing code. Both of these degrees of processor starvation may result from bus traffic resulting in the processor 202 being excluded from access to its backup cache 226.

While bus read transactions require the backup caches 226 to be probed, this results in the processor 202 from being denied access only briefly, even when a cache entry must be read out and placed on the system bus 28 in response to the read, because it is DIRTY, such read transactions are not likely to result in total or near total processor starvation.

However, bus write transactions unlike bus read transactions, pose a greater threat of causing such processor starvation. The increased threat of processor starvation resulting from bus write transactions, is a result of the greater amount of time, as compared to a bus read operation, which is required to access the backup caches 226 in order to update or invalidate the backup cache entries as required by the implemented backup cache update v. invalidate scheme. Accordingly, back-to-back bus write transactions, i.e. bus write transactions without any bus idle cycles in between each transaction, may pose a significant threat of near total or total processor starvation.

In the case of repeated back to back bus write transactions, the processor 202 may be totally or almost totally excluded from accessing its backup cache 226. Thus, the processor 202 may have to stall until there is a break between the back-to-back bus write transactions before it can once again access its backup cache 226 and proceed with the execution of code.

In order to avoid such periods of possible total or near total processor starvation, the bus arbiter logic block 256 of the odd slice 236 of the primary CPU module's bus interface unit 232 monitors the number of back-to-back system bus 28 write transactions. To insure that the processor 202 is given sufficient access to its backup cache 226, so that it may continue to make progress executing code, when the bus arbiter logic block 256 of the odd slice of the primary CPU module's bus interface unit 232 detects the occurrence of three back-to-back bus write transactions, an idle bus cycle is forced by the arbiter logic block 256. This is done by the arbiter logic block 256 not granting access to the system bus 28 to any module on the system bus 28 until a delay of one bus clock cycle has passed.

Since the clock speed of the processor 202 is much higher than the clock speed of the system bus clock 260, a single bus clock idle cycle which comprises one bus clock cycle provides the processor 202 sufficient time to perform a meaningful backup cache operation. Accordingly, the idle cycle, following each third back-to-back bus write transaction gives each processor 202 sufficient time to access its backup cache 226 at least once before a new bus transaction occurs. Thus, each processor 202 is insured of at least one chance to access its backup caches 226 after every three back-to-back bus write transactions. In this manner, the possibility of total or near total processor starvation as a result of back-to-back system bus write transactions is avoided.

The above method of inserting an idle bus cycle after three back-to-back bus write transactions avoids the occurrence of total processor starvation as a result of bus write transactions. However, when the system bus 28 is heavily loaded as a result of system bus transactions of all types, system bus interface 232 access to the backup cache 226 which is required to respond to the bus traffic, may end up being favored over processor 202 access to the backup cache 226. This may lead to the processor 202 being left with a disproportionately small share of access to its own backup cache 226 and result in processor 202 progress in executing code being out of balance with the amount of system bus traffic in the computer system 10.

In order to avoid the above problem, which may result in partial processor starvation, the arbiter logic block 256 of the primary CPU module's bus interface unit's odd slice 236 may be programmably set to operate in a mode where sufficient idle bus cycles are forced between every bus transaction to permit the processors 202 to access their backup caches 226 after every system bus 28 transaction. This system bus arbitration mode may be selected to optimize overall system performance, when the computer system 10 is given a workload which results in heavy or excessive amounts of bus traffic. When in this arbitration mode, the arbiter logic block 256 withholds the next grant of access to the system bus 28 until two idle bus cycles have occurred on the system bus 28, after the completion of the last system bus transaction, in order to permit each processor 202 access to its backup cache 226 after each bus transaction. Two idle bus cycles are used in this case, since a single idle bus cycle provides insufficient time for the processor 202 to access its backup cache 226 after some types of bus transactions.

Thus, by inserting two idle bus cycles after each bus transaction, the processor 202 is always provided an opportunity to access its backup cache 226 regardless to the type of bus transaction which previously took place and the problem of partial processor starvation is resolved.

In the above manner, by implementing a bus arbitration logic scheme which monitors access to the backup caches 226 and inserts idle bus cycles after every three back-to-back bus write transactions and, by providing a selectable arbitration mode which inserts idle bus cycles after every bus transaction, the computer system 10 of the present invention avoids the problem of processor starvation while maintaining coherency. Furthermore, this result is achieved without the need to implement a dual ported backup cache 226, which is costly to implement and has the potential for introducing data coherency problems.

In accordance with the implemented system bus protocol, modules on the system bus 28 must request access to the system bus 28 by first asserting a BUS_REQUEST signal over the system bus 28. The bus arbitration logic block 256 of the primary CPU module's system bus interface odd slice 236 recognizes these requests and arbitrates bus access between the various modules on the system bus 28 according to a preselected arbitration scheme. Whenever the bus arbitration logic block 256 grants access of the system bus 28 to a particular module, so that a system bus transaction may proceed, each processor 202 will be denied access to its backup cache 226 as described above as a result of the system bus transaction and the implemented SNOOPING system bus protocol.

In order to insure the timely and efficient relinquishment of access to the backup cache 226 by the processor 202, when the cache must be accessed as a result of a bus transaction, the bus arbiter logic block 256, of the primary CPU module's backup cache's odd slice 236, asserts a backup cache request signal BC_REQ on the system bus 28. This causes the even bus slice 234 of each CPU module's system bus interface unit 232 to assert a backup cache access control signal, BC_ACC_CTRL which serves as an input to the high speed synchronizer 239. The synchronizer 239, in turn, generates a TAG_OK signal in response to the assertion of the BC_ACC_CTRL input signal. This TAG_OK signal is supplied to the processor 202 one bus cycle before a module on the system bus 28 is granted access to the system bus 28. This early indication that the processors 202 will have to relinquish control of access to the backup cache 226 allows the processor 202 to complete any ongoing transaction and gracefully relinquish the backup cache 226 before the backup cache 226 must be accessed by the CPU module's system bus interface unit 232 in accordance with the implemented Snooping system bus protocol.

In the above manner, access to the backup cache 226 may be relinquished by the processors 202 in an efficient and timely manner without the need for the wasteful and inefficient elongation of bus transactions which might otherwise be required to provide the processor 202 sufficient time to relinquish access to the backup cache 226.

In addition to the above functions, the bus arbiter logic block 256 of the odd slice 236 of the primary CPU module's bus interface unit 232, monitors the system bus 28 for command errors. If a command error is detected, whether it be a parity error or an illegal command type, the bus arbiter logic block 256 assumes that the command type is that of a maximum length transaction. Accordingly, the bus arbiter logic block 256 will not grant another module on the system bus 28 access to the system bus 28 until the duration of the maximum length transaction has passed.

If the bus arbiter logic block 256 of the odd slice of the primary CPU module's system bus interface unit 232 failed to wait the maximum length of a system bus transaction, before issuing the next grant of access to the system bus 28, two modules on the system bus 28 may decode the command containing the error differently. In such a case, a grant of system bus access to a particular module on the system bus 28, before the particular module reaches the idle state, may be missed.

By waiting the maximum length of a system bus transaction before granting a module access to the system bus 28, all bus participants, e.g. modules on the system bus 28 which are involved with the bus transaction, will reach an idle state before the next grant of access to the system bus 28 is made by the bus arbitration logic block 256.

In the above manner, timing and synchronization problems which may result from command errors are avoided, without elongating all bus transactions to the same size as is done in known computer systems. Thus, the computer system 10 of the present invention avoids the associated delay and wasted bus bandwidth that results from the elongation of bus transactions.

The computer system 10 of the present invention, implements control flow logic, during read type bus operations, which is the same for read transactions involving errors and for read transactions which are error free. Thus, the timing problems which might normally arise from treating error transactions differently from non-error transactions are avoided.

Furthermore, the implemented control flow of the computer system 10 permits the system bus interface unit 232, of each of the CPU modules 14, 16, to check all read transactions for data errors in sufficient time for any subsequent bus transactions to proceed without delay. Upon recognition of such errors, in accordance with the control flow logic of the present invention, the errors are promptly reported to the processor 202. Thus, data coherency problems which may result from the delay in detecting and reporting such errors are avoided.

Each slice 234, 236 of the system bus interface unit 232 receives a 64 bit portion, referred to as a data slice, of each 128 bit portion of a 256 bit data line being transferred to or from memory via the system bus interface unit 232. The even slice 234 receives the two longwords of each 128 bit portion of data being transferred which have even addresses while the odd slice 236 receives the two longwords of each 128 bit portion of data which have odd addresses.

Each slice 234, 236 of the bus interface unit 232 comprises a state machine 241 which is coupled to the system bus 28 and the CPU module's internal data bus 222. The state machine 241 of each slice implements control logic for controlling the flow of data returned by the system bus 28 in response to a read operation.

Figure 8A:
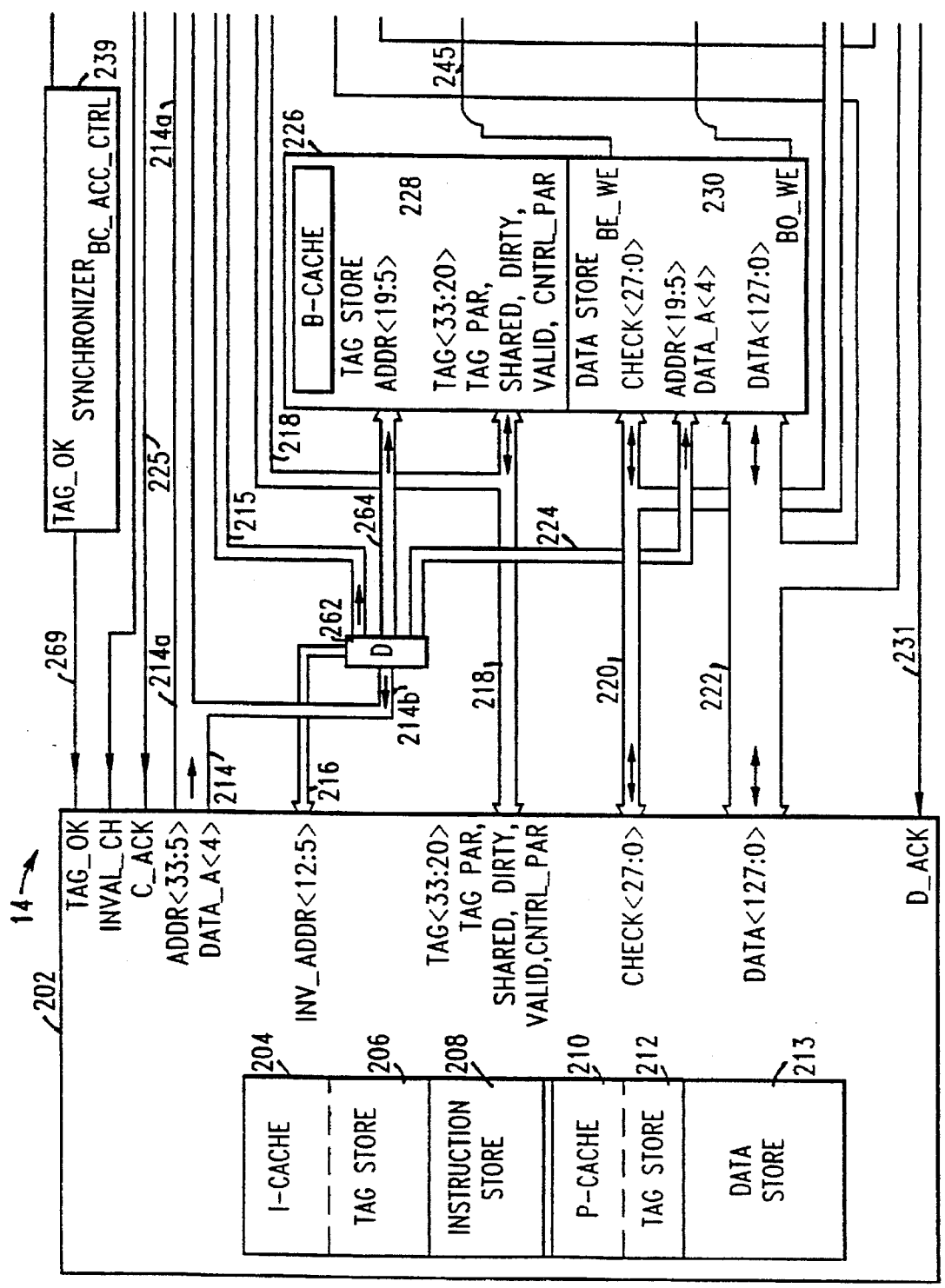
FIG. 8 is a further illustration of the CPU module of FIG. 3.
Figure 8B:
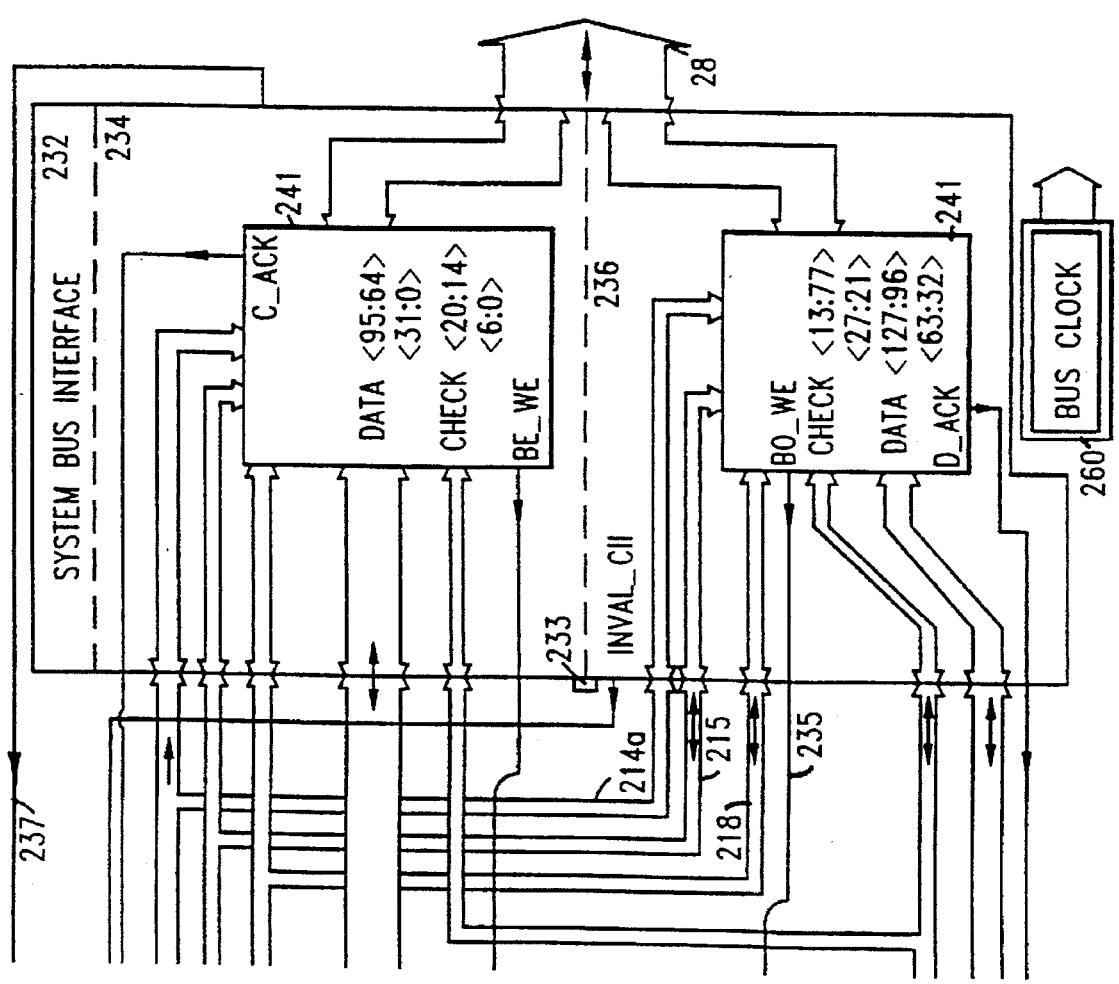

Referring now to FIG. 8, the CPU module 14 of FIG. 3 is illustrated with the bus connections to the bus interface unit's state machines 241 shown in greater detail. In FIGS. 3 and 8, the same elements are given identical numbers. Each state machine 241 of the even slice 234 and the odd slice 236, of the system bus interface unit 232, is coupled to the uni-directional TAG address bus 214A, the bi-directional cache index bus 215, the bi-directional TAG address bus 218 and the system bus 28.

The state machine 241 of the even slice 234 of the system bus interface unit 232 is coupled to lines <95:64> and lines <31:0> of the data bus 222. Lines <20:14> and lines <6:0> of the check data bus 220 are coupled to the state machine 241 of the even bus interface slice 234.

The state machine 241 of the even data slice 234 has two control signal outputs in addition to the data and control signal inputs and outputs described above. A data cycle signal acknowledgement signal, C_ACK, output of the even slice's state machine 241 is coupled to a corresponding C_ACK signal input of the processor 202. An even slice backup cache write enable signal, BE_WE, output of the even slice's state machine 241 is coupled to a BE_WE signal input of the backup cache 245. The BE_WE signal is asserted by the even slice 234 of the bus interface unit 232 to enable the backup cache 226 to write the data into the backup cache 226.

The odd slice's state machine 241 is coupled to lines <13:7> and lines <28:21> of the check data bus 235 and is also coupled to lines <127:96> and lines <63:32> of the data bus 222. The odd slice's state machine 241 has a write enable signal, BO_WE, output which is coupled to a BO_WE signal input of the backup cache 226. A data acknowledgement signal, D_ACK, output of the odd slice's state machine 241 is coupled to a D_ACK signal input of the processor 202 by a bus 231.

The computer system 10 uses various status control signals (CUC_ERROR), two modes of data error correction code (ECC) check bits (good_ecc, bad_ecc) and other handshake signals (BE_WE, BO_WE, DACK, CACK), and the hard-error signal to define a state machine control flow for the handling of read transactions by the CPU module's system bus interface unit 232. The odd and even slice backup cache write enable signals, BO_WE and BE_WE, respectively, are asserted by the system bus interface unit 232 to write data to the backup cache 226.

The implemented state machine control flow for read transactions provides efficient handshaking of the two asynchronous systems, e.g. the system bus 28 and the processor 202, while providing a single state machine control flow which handles the transfer of data during read transactions with or without errors.

The state machine control flow of the present invention for read transactions can be described as a series of steps. First, data is received by the system bus interface unit 232 from the system bus 28 and checked for errors. Errors which are checked, include parity errors and hard errors, where hard errors may include, e.g., uncorrectable read errors which were detected when the module responding to the read transaction attempted to read the requested data.

The step of checking for errors occurs in the following manner. Each slice of data which is received in response to a read request is checked by the system bus interface unit 232 for parity errors. This is done by calculating the proper value of the parity bits for the data received and then by comparing it to the value of the parity bits received with the data. If the calculated and received parity bit values do not match, a parity error exists.

In addition to checking for parity errors, as the data is received, the system bus interface unit 232 monitors the system bus 28 to determine if the system bus hard error signal, CUC_ERROR, is asserted by the module responding to the read request. The CUC_ERROR signal may be asserted by the module supplying the data, to indicate that either one of the even or odd data slices, which comprise the data line being read, contains a hard error. Assertion of the CUC_ERROR signal indicates that the module supplying the data encountered an unrecoverable read error when it attempted to read the data required to respond to the read request. Thus, while the data sent in response to the read request may have correct parity, it may still contain data errors if the CUC_ERROR signal is asserted.

After each of the odd and even slices of a 128 bit portion of data, received in response to the read operation is checked for hard errors, an error correction code ("ECC") is generated by the state machine 241 of each slice 234, 236 of the system bus interface unit 232. If a hard error was associated with a slice of received data, the control flow logic forces the bus interface unit 232 to generate a bad ECC for that portion of the received data. However, as in the normal case, when no hard error is associated with the received slice of data, a good ECC is generated for that particular slice of data even if a parity error was associated with the data.

After the system bus interface unit 232 has generated the ECC code corresponding to each received slice of data, the data is written to the backup cache 226 along with the ECC code which was generated by the system bus interface unit 232. This writing of the data to the backup cache 226 is accomplished through the assertion of the backup cache write enable signals BO_WE and BE_WE, for the even and odd data slices respectively, and by the bus interface units supplying of the necessary address, control and data information via the buses 218, 220, 222. The data written into the backup cache 226, in this manner, will contain any errors which were present when the data was received by the system bus interface unit 232.

In addition to writing the data to the backup cache 226, the data is returned to the processor 202 which initiated the read operation via the same buses 218, 220, 222 used to supply the data, address and control information to the backup cache 226. This is accomplished via the assertion of the acknowledgement signal D_ACK, which is asserted to indicate that the even and odd data slices which comprises one 128 bit portion of the data line requested by the processor 202 are on the data bus 222 and may be read in by the processor 202.

The ECC, generated by the bus interface unit 232, corresponding to each slice of data, is supplied to the processor 202 along with the data. As with the data written to the backup cache 226, the data supplied to the processor 202 contains the parity and hard errors that existed when the data was received from the system bus 28.

With the return of the data to the processor 202, the processor is supplied, via the bus 231, with an acknowledgement signal, CACK or hard_error, indicating whether the 128 bit portion of data received in response to the read transaction was good or bad. If the data received by the bus interface unit 232 during the read transaction was error free, the CACK signal is asserted. However, if a parity error, a hard error, or both were detected by the bus interface unit 232 during the read transaction, the processor 202 will be supplied with a hard_error signal as the cycle acknowledgement signal after the second 128 bit portion of a 256 bit data line is read. Assertion of the hard_error signal informs the processor 202 of the occurrence of an error during the read transaction. The processor 202 may then proceed to investigate and correct the error.

Referring now to FIG. 9, the operation of the above state machine control flow is illustrated in the Table of FIG. 9.

The Table of FIG. 9 illustrates five general cases that may occur when a first and second 128 bit portions of a 256 bit data line is returned to a bus interface unit 232 in response to a read transaction. The Table of FIG. 9 further lists the action, in accordance with the implemented control flow, that the bus interface unit 232 takes in response to the various cases.

Columns 1 and 2 of the Table of FIG. 9 represent the return of the two 128 bit portions that comprise the 256 bit data line being read. Each returned 128 bit portion of data slice may be accompanied by either a parity error, or a hard error or both, the hard error being detected via the system bus interface unit's 232 receipt of the signal CUC_ERROR from the system bus 28.

Columns 3 and 4 of FIG. 9, show the assertion of the backup cache write enable signals, BE_WE and BO_WE. The signals BE_WE and BO_WE are asserted, and supplied to the backup cache 226 to write the even and odd data slices, respectively, to the backup cache 226 as each 128 bit portion of data is received by the bus interface unit 232. Columns 3 and 4 also show the status of the ECC written to the backup cache 226 along with the corresponding data where the ECC is used to indicate whether the data is good or bad.

Columns 5 and 6 of FIG. 9 illustrate the assertion of the processor acknowledgement signal, D_ACK. This signal is used, to indicate to the processor 202 via the bus 231, that each 128 bit portion of data received in response to the read operation, is ready for use by the processor 202. Columns 5 and 6 also show the status of the ECC associated with the data being supplied to the processor 202 from the system bus interface unit 232.

Finally, column 7 of FIG. 9 illustrates whether the hard_error signal or the C_ACK signal will be asserted at the completion of each one of the read transactions illustrated in the Table of FIG. 9.

Case 1, corresponding to row 1 of FIG. 9 illustrates an error free read transaction. In Case 1, both the first and second 128 bit portion of data received by the system bus interface unit 232 are received error free, as indicated by the words "OK" in columns 1 and 2. In accordance with the implemented control flow logic, the first and second 128 bit portions of the 256 bit line of data, received by the bus interface unit 232 in Case 1, are written with good ECCs to the backup cache 232, as indicated by the assertion of the backup cache write enable control signals, BO_WE and BE_WE along with good ECCs as illustrated in columns 3 and 4 of FIG. 9.

The processor 202, is also supplied with the first and second 128 bit portions of the 256 bit data line along with good ECCS which are associated with each 128 bit portion of data as can be seen by the assertion of the D_ACK processor acknowledgement signals, supplied in conjunction with both the odd and even data slices.

The D_ACK signal is asserted, as illustrated in columns 5 and 6 of Table 9, to indicate to the processor 202 that each 128 bit portion of the requested read data has been returned and may be read in by the processor 202. In the case of a good read data transaction the transaction acknowledgement signal CACK is asserted and supplied to the processor 202 to indicate that the read transaction was successful and that no data errors were detected during the read transaction. This action is illustrated in column 7 of FIG. 9.

Cases 2 and 3 illustrated in rows 2 and 3 of FIG. 9, respectively, represent the receipt of data in response to a read operation containing parity errors. In case 2 a parity error is detected in the first 128 bit portion of data. However, in Case 3 a parity error is detected in the second 128 bit portion of data returned in response to a read transaction. As illustrated, by the assertion of the signals DO_WE, DE_WE, and D_ACK in rows two and three of FIG. 9, when parity errors are detected during a read transaction the data is written to the backup cache 226 and supplied to the processor 202 with the uncorrected parity errors. However, as illustrated in column 7 of FIG. 9, the processor 202 is informed of the presence of a data error through the assertion of the hard_error signal, as opposed to a CACK signal. Thus, the processor 202 is promptly alerted to a problem with the data being received and may proceed to investigate the source of the error.

As described above in addition to parity errors, hard errors which are detected by the module supplying the data in response to the bus read transaction, may be associated with either 128 bit portion of a 256 bit line of data. When such errors are detected by the module supplying the requested data, the module supplies the data in conjunction with an asserted CUC_ERROR signal which, in turn, is detected by the system bus interface unit 232.

Cases 4 and 5, illustrated in rows 4 and 5 of FIG. 9, represent the receipt of data, by the bus interface unit 232, which contains a hard error. As illustrated by the presence of the signal CUC_ERROR in column 1 of row 4 and column 2 of row 5, Case 4 represents the case where a hard error is associated with the first 128 bit portion of data received, while Case 5 represents the case in which a hard error is present in the second 128 bit portion of data received.

In accordance with the above control flow logic, the ECC generated for the 128 bit portion of data associated with the hard error is forced to be bad, i.e. wrong. The data, with the bad ECC, is then written to the backup cache 226 and supplied to the processor 202 with the bad ECC, as illustrated by the assertion of the signals BO_WE, BE_WE, and D_ACK shown in columns 3 through 6 of FIG. 9.

Since, in cases 4 and 5 of FIG. 9, a hard error was associated with the data received by the bus interface unit, the hard error transaction acknowledgement signal is supplied to the processor 202 via the bus 231, so that in both of the cases shown in Column 7 of FIG. 9 the processor 202 is informed of the occurrence of an error.

In the event that both a parity error and hard error are detected in a first or second 128 bit portion of data that is returned in response to a read operation, the control flow logic will be the same as shown in cases 4 and 5 of FIG. 9. That is, the data which is returned to the CPU module 14, 16 will be written to the backup cache 226 and supplied to the processor 202 with a bad ECC code being associated with the 128 bit portion of data which contained the parity and hard error. The processor 202 will also receive the hard_error signal instead of a C_ACK signal as a cycle acknowledgement signal indicating to the processor 202 that a data error has been detected.

As illustrated in FIG. 9, the above state machine control flow implemented by the system bus interface unit 232, for read transactions, provides no exception flow difference between error free transactions and those transactions which involve errors. In any read transaction, the returning of data to the backup cache 226 and the processor 202 is complete before the bus interface unit 232 needs to be available for the next possible system bus transaction. Thus, no timing problem arises as a result of the handling of transactions involving errors, and subsequent bus transactions need not be delayed as a result of the presence of errors.

While avoiding system bus timing problems that might result from the handling of transactions involving errors, the above method of handling the control flow in the bus interface unit 232, preserves data integrity and coherency throughout the computer system 10.

While, in accordance with the above method, data containing parity and hard errors are written to the backup cache 226 and supplied to the processor 202, the processor is promptly informed of the existence of the error through the assertion of the hard_error signal as a response to its data request. Assertion of the hard_error signal forces the processor 202, which can check the bus interface's CSR 240 for information on the error, to investigate and correct the source of the error. In this manner, the processor 202 is informed of the data error and will not use the faulty data.

Data integrity is also maintained via the forcing of a bad ECC, to be associated with any data returned from the system bus 28 which contained a hard error. The bad ECC check bits indicate the invalidity of the data insuring that the data will not accidentally be supplied to the processor 202 or to the system bus 28 as valid data.

Thus, the above error handling control flow provides a fast and efficient way of informing the processor 202 of any errors while insuring that bad data will not be used during the time required by the processor 202 to investigate and correct the error.

What is claimed is:

1. A method of managing a cache upon detection of an address TAG parity error, the cache including a plurality of entries for storage of data, and each entry having a corresponding address TAG entry, the method comprising the steps of:

performing a TAG parity check for each access to the cache;

upon detection of a parity error in an address TAG; disabling allocation of TAG entries for storage of new address TAGs;

indicating the TAG parity error to an error correction mechanism; and while said allocation is disabled, allowing access to and modification of data and status bits of said plurality of cache entries such that the cache operates as if no error had been detected with the exception of said disabling allocation of TAG entries for storage of new address TAGS.

2. The method according to claim 1 further comprising the step of:

leaving said entry corresponding to said parity error unmodified until said parity error is investigated.

3. The method of claim 1 wherein said performing, disabling and indicating steps are performed automatically by a bus interface unit.

4. The method of claim 1 wherein, upon detection of a tag parity error during a system but transaction, the transaction is converted to a no-op transaction.

5. The method of claim 1 wherein information corresponding the TAG parity error is stored in a control and status register (CSR).

6. The method of claim 5 wherein a multiple error detected bit is set when additional TAG parity errors are detected subsequent the TAG parity error but prior to correction of the TAG parity error; and wherein information corresponding to the additional TAG parity errors is not stored in the CSR.

7. A cache memory system including a plurality of entries for storage of data, with each entry having a corresponding address TAG entry, said system comprising:

means for performing a TAG parity check for each access to the cache;

means for detecting a parity error in an address TAG;

means responsive to detection of the parity error for disabling allocation of TAG entries for storage of new address TAGs;

means for indicating the TAG parity error to an error correction mechanism; and means for providing continued access to the cache entries prior to correction of the TAG parity error as if no error had been detected with the exception of said disabling allocation of TAG entries for storage of new address TAGs.

8. The cache memory system of claim 7 wherein the means for providing continued access includes means for altering values of status bits associated with each of said plurality of entries including those entries having TAG parity errors.

9. The cache memory system of claim 7 wherein said means for providing continued access includes means for updating a cache entry, including those entries having TAG parity errors, in accordance with an update versus invalidate policy when said access results in a hit during a write operation.

10. The cache memory system of claim 7 wherein said means for providing continued access includes means for supplying data, from a cache entry having no TAG parity error, in response to a read operation resulting in which a cache hit has occurred corresponding to said entry.

* * * * *